United States Patent
Lutz et al.

(10) Patent No.: US 6,952,041 B2
(45) Date of Patent: Oct. 4, 2005

(54) ANCHORS FOR MICROELECTROMECHANICAL SYSTEMS HAVING AN SOI SUBSTRATE, AND METHOD OF FABRICATING SAME

(75) Inventors: Markus Lutz, Palo Alto, CA (US); Aaron Partridge, Palo Alto, CA (US); Silvia Kronmueller, Schwaikheim (DE)

(73) Assignee: Robert Bosch GmbH, Stuttgart (DE)

( * ) Notice: Subject to any disclaimer, the term of this patent is extended or adjusted under 35 U.S.C. 154(b) by 75 days.

(21) Appl. No.: 10/627,237

(22) Filed: Jul. 25, 2003

(65) Prior Publication Data

US 2005/0019974 A1 Jan. 27, 2005

(51) Int. Cl.[7] .......................... H01L 29/82; G01P 15/00
(52) U.S. Cl. ................... 257/415; 257/417; 73/514.21
(58) Field of Search ............................... 257/415–417, 257/254; 73/514.21

(56) References Cited

U.S. PATENT DOCUMENTS

| | | |
|---|---|---|
| 4,665,610 A | 5/1987 | Barth |
| 4,674,319 A | 6/1987 | Muller et al. |
| 4,766,666 A | 8/1988 | Sugiyama et al. |
| 4,849,071 A | 7/1989 | Evans et al. |
| 4,945,769 A | 8/1990 | Sidner et al. |
| 4,990,462 A | 2/1991 | Sliwa, Jr. |
| 5,053,627 A | 10/1991 | Ruffell et al. |
| 5,075,253 A | 12/1991 | Sliwa, Jr. |
| 5,080,730 A | 1/1992 | Wittkower |
| 5,139,624 A | 8/1992 | Searson et al. |
| 5,156,903 A | 10/1992 | Okumura et al. |
| 5,196,355 A | 3/1993 | Wittkower |
| 5,288,650 A | 2/1994 | Sandow |
| 5,338,416 A | 8/1994 | Mlcak et al. |

(Continued)

FOREIGN PATENT DOCUMENTS

| | | |
|---|---|---|
| EP | 0 451 992 | 10/1991 |
| GB | 2 198 611 | 6/1988 |
| WO | WO 97/49475 | 12/1997 |
| WO | WO 01/46066 | 6/2001 |
| WO | WO 01/77008 | 10/2001 |
| WO | WO 01/77009 | 10/2001 |

OTHER PUBLICATIONS

"Vacuum Sealing of Microcavities Using Metal Evaporation", Bartek et al., Sensors and Actuators A 61, 1997, pp. 364–368.

"Vacuum Packaging Technology Using Localized Aluminum/Silicon–to–Glass Bonding", Cheng et al., MEMS 2001, 14th IEEE International Conference, pp. 18–21, 2001.

"A Hermetic Glass–Silicon Package Formed Using Localized Aluminum/Silicon–Glass Bonding", Cheng et al., Journal of Microelectromechanical Systems, vol. 10, No. 3, Sep. 2001, pp. 392–399.

"MEMS Post–Packaging by Localized Heating and Bonding", Lin, IEEE Transactions on Advanced Packaging, vol. 23, No. 4, Nov. 2000, pp. 608–616.

(Continued)

Primary Examiner—Mark V. Prenty
(74) Attorney, Agent, or Firm—Neil A. Steinberg

(57) ABSTRACT

There are many inventions described and illustrated herein. In one aspect, the present invention is directed to a MEMS device, and technique of fabricating or manufacturing a MEMS device having mechanical structures and anchors to secure the mechanical structures to the substrate. The anchors of the present invention are comprised of a material that is relatively unaffected by the release processes of the mechanical structures. In this regard, the etch release process are selective or preferential to the material(s) securing the mechanical structures in relation to the material comprising the anchors. Moreover, the anchors of the present invention are secured to the substrate in such a manner that removal of the insulation layer has little to no affect on the anchoring of the mechanical structures to the substrate.

48 Claims, 37 Drawing Sheets

U.S. PATENT DOCUMENTS

| | | | |
|---|---|---|---|
| 5,369,544 A | 11/1994 | Mastrangelo | |
| 5,445,991 A | 8/1995 | Lee | |
| 5,455,547 A | 10/1995 | Lin et al. | |
| 5,461,916 A | 10/1995 | Fujii et al. | |
| 5,470,797 A | 11/1995 | Mastrangelo | |
| 5,476,819 A | 12/1995 | Warren | |
| 5,491,604 A | 2/1996 | Nguyen et al. | |
| 5,504,026 A | 4/1996 | Kung | |
| 5,510,156 A | 4/1996 | Zhao | |
| 5,517,123 A | 5/1996 | Zhao et al. | |
| 5,537,083 A | 7/1996 | Lin et al. | |
| 5,540,095 A | 7/1996 | Sherman et al. | |
| 5,576,250 A * | 11/1996 | Diem et al. | 438/50 |
| 5,583,290 A | 12/1996 | Lewis | |
| 5,589,082 A | 12/1996 | Lin et al. | |
| 5,604,312 A | 2/1997 | Lutz | |
| 5,605,598 A | 2/1997 | Greiff | |
| 5,613,611 A | 3/1997 | Johnson et al. | |
| 5,616,514 A | 4/1997 | Muchow et al. | |
| 5,620,931 A | 4/1997 | Tsang et al. | |
| 5,627,317 A | 5/1997 | Offenberg et al. | |
| 5,627,318 A | 5/1997 | Fujii et al. | |
| 5,631,422 A | 5/1997 | Sulzberger et al. | |
| 5,640,039 A | 6/1997 | Chau et al. | |
| 5,645,684 A | 7/1997 | Keller | |
| 5,660,680 A | 8/1997 | Keller | |
| 5,679,436 A | 10/1997 | Zhao | |
| 5,683,591 A | 11/1997 | Offenberg | |
| 5,703,293 A | 12/1997 | Zabler et al. | |
| 5,721,377 A | 2/1998 | Kurle et al. | |
| 5,723,353 A | 3/1998 | Muenzel et al. | |
| 5,725,729 A | 3/1998 | Greiff | |
| 5,728,936 A | 3/1998 | Lutz | |
| 5,747,353 A | 5/1998 | Bashir et al. | |
| 5,751,041 A | 5/1998 | Suzuki et al. | |
| 5,760,305 A | 6/1998 | Greiff | |
| 5,760,455 A | 6/1998 | Hierold et al. | |
| 5,761,957 A | 6/1998 | Oba et al. | |
| 5,804,083 A | 9/1998 | Ishii et al. | |
| 5,818,227 A | 10/1998 | Payne et al. | |
| 5,839,062 A | 11/1998 | Nguyen et al. | |
| 5,847,280 A | 12/1998 | Sherman et al. | |
| 5,858,809 A | 1/1999 | Chau et al. | |
| 5,872,024 A | 2/1999 | Fujii et al. | |
| 5,880,369 A | 3/1999 | Samuels et al. | |
| 5,882,532 A | 3/1999 | Field et al. | |
| 5,889,207 A | 3/1999 | Lutz | |
| 5,898,218 A | 4/1999 | Hirose et al. | |
| 5,919,364 A | 7/1999 | Lebouitz et al. | |
| 5,922,212 A | 7/1999 | Kano et al. | |
| 5,937,275 A | 8/1999 | Münzel et al. | |
| 5,948,991 A | 9/1999 | Nomura et al. | |
| 5,955,932 A | 9/1999 | Nguyen et al. | |
| 5,959,208 A | 9/1999 | Muenzel et al. | |
| 5,962,949 A | 10/1999 | Dhuler et al. | |
| 5,969,249 A | 10/1999 | Roessig et al. | |
| 5,969,250 A | 10/1999 | Greiff | |
| 5,986,316 A | 11/1999 | Toyoda et al. | |
| 5,987,989 A | 11/1999 | Yamamoto et al. | |
| 5,992,233 A | 11/1999 | Clark | |
| 6,009,753 A | 1/2000 | Tsang et al. | |
| 6,028,332 A | 2/2000 | Kano et al. | |
| 6,035,714 A | 3/2000 | Yazdi et al. | |
| 6,048,774 A | 4/2000 | Yamamoto et al. | |
| 6,055,858 A | 5/2000 | Muenzel et al. | |
| 6,065,341 A | 5/2000 | Ishio et al. | |
| 6,067,858 A | 5/2000 | Clark et al. | |
| 6,090,718 A | 7/2000 | Soga et al. | |
| 6,100,108 A | 8/2000 | Mizuno et al. | |
| 6,106,735 A | 8/2000 | Kurle et al. | |
| 6,117,701 A | 9/2000 | Buchan et al. | |
| 6,119,518 A | 9/2000 | Itou et al. | |
| 6,122,964 A | 9/2000 | Mohaupt et al. | |
| 6,125,700 A | 10/2000 | Tsugai et al. | |
| 6,136,630 A | 10/2000 | Weigold et al. | |
| 6,137,206 A | 10/2000 | Hill | |
| 6,140,709 A | 10/2000 | Muenzel et al. | |
| 6,142,358 A | 11/2000 | Cohn et al. | |
| 6,146,917 A | 11/2000 | Zhang et al. | |
| 6,147,756 A | 11/2000 | Zavracky et al. | |
| 6,149,190 A | 11/2000 | Galvin et al. | |
| 6,151,966 A | 11/2000 | Sakai et al. | |
| 6,153,839 A | 11/2000 | Zavracky et al. | |
| 6,156,652 A | 12/2000 | Michalicek | |
| 6,163,643 A | 12/2000 | Bergmann et al. | |
| 6,170,332 B1 | 1/2001 | MacDonald et al. | |
| 6,171,881 B1 | 1/2001 | Fujii | |
| 6,187,210 B1 | 2/2001 | Lebouitz et al. | |
| 6,187,607 B1 | 2/2001 | Offenberg et al. | |
| 6,191,007 B1 | 2/2001 | Matsui et al. | |
| 6,192,757 B1 | 2/2001 | Tsang et al. | |
| 6,199,430 B1 | 3/2001 | Kano et al. | |
| 6,199,874 B1 | 3/2001 | Galvin et al. | |
| 6,204,085 B1 | 3/2001 | Strumpell et al. | |
| 6,210,988 B1 | 4/2001 | Howe et al. | |
| 6,214,243 B1 | 4/2001 | Muenzel et al. | |
| 6,218,717 B1 | 4/2001 | Toyoda et al. | |
| 6,218,762 B1 | 4/2001 | Hill et al. | |
| 6,227,049 B1 | 5/2001 | Fujii | |
| 6,227,050 B1 | 5/2001 | Fujii et al. | |
| 6,230,567 B1 | 5/2001 | Greiff | |
| 6,233,811 B1 | 5/2001 | Payne et al. | |
| 6,236,281 B1 | 5/2001 | Nguyen et al. | |
| 6,240,782 B1 | 6/2001 | Kato et al. | |
| 6,244,112 B1 | 6/2001 | Fujii | |
| 6,245,593 B1 | 6/2001 | Yoshihara et al. | |
| 6,248,642 B1 | 6/2001 | Dolan et al. | |
| 6,249,073 B1 | 6/2001 | Nguyen et al. | |
| 6,250,156 B1 | 6/2001 | Seshia et al. | |
| 6,250,165 B1 | 6/2001 | Sakai et al. | |
| 6,251,754 B1 | 6/2001 | Ohshima et al. | |
| 6,255,741 B1 | 7/2001 | Yoshihara et al. | |
| 6,257,059 B1 | 7/2001 | Weinberg et al. | |
| 6,264,363 B1 | 7/2001 | Takahashi et al. | |
| 6,274,452 B1 | 8/2001 | Miura et al. | |
| 6,275,034 B1 | 8/2001 | Tran et al. | |
| 6,276,207 B1 | 8/2001 | Sakai et al. | |
| 6,279,585 B1 | 8/2001 | Shiraki et al. | |
| 6,282,960 B1 | 9/2001 | Samuels et al. | |
| 6,284,670 B1 | 9/2001 | Abe et al. | |
| 6,287,885 B1 | 9/2001 | Muto et al. | |
| 6,291,315 B1 | 9/2001 | Nakayama et al. | |
| 6,291,875 B1 | 9/2001 | Clark et al. | |
| 6,291,922 B1 | 9/2001 | Dhuler | |
| 6,296,779 B1 | 10/2001 | Clark et al. | |
| 6,297,072 B1 | 10/2001 | Tilmans et al. | |
| 6,300,294 B1 | 10/2001 | Robbins et al. | |
| 6,307,815 B1 | 10/2001 | Polosky et al. | |
| 6,308,567 B1 | 10/2001 | Higuchi et al. | |
| 6,311,555 B1 | 11/2001 | McCall et al. | |
| 6,315,062 B1 | 11/2001 | Alft et al. | |
| 6,318,175 B1 | 11/2001 | Muchow et al. | |
| 6,323,550 B1 | 11/2001 | Martin et al. | |
| 6,325,886 B1 | 12/2001 | Harris et al. | |
| 6,352,935 B1 | 3/2002 | Collins et al. | |
| 6,373,007 B1 | 4/2002 | Calcatera et al. | |
| 6,378,989 B1 | 4/2002 | Silverbrook | |
| 6,379,989 B1 | 4/2002 | Kubby et al. | |
| 6,386,032 B1 | 5/2002 | Lemkin et al. | |
| 6,388,279 B1 | 5/2002 | Sakai et al. | |
| 6,389,899 B1 | 5/2002 | Partridge et al. | |

| | | |
|---|---|---|
| 6,389,903 B1 | 5/2002 | Oba et al. |
| 6,391,673 B1 | 5/2002 | Ha et al. |
| 6,392,144 B1 | 5/2002 | Filter et al. |
| 6,396,372 B1 | 5/2002 | Sakata et al. |
| 6,396,711 B1 | 5/2002 | Degani et al. |
| 6,402,968 B1 | 6/2002 | Yazdi et al. |
| 6,410,361 B2 | 6/2002 | Dhuler et al. |
| 6,413,793 B1 | 7/2002 | Lin et al. |
| 6,416,831 B1 | 7/2002 | Hara et al. |
| 6,417,078 B1 | 7/2002 | Dolan et al. |
| 6,422,078 B2 | 7/2002 | Imai |
| 6,423,563 B2 | 7/2002 | Fukada et al. |
| 6,423,975 B1 | 7/2002 | Smick et al. |
| 6,424,074 B2 | 7/2002 | Nguyen |
| 6,429,458 B1 | 8/2002 | Weigold et al. |
| 6,429,506 B1 | 8/2002 | Fujii et al. |
| 6,433,342 B1 | 8/2002 | Cordts, III et al. |
| 6,433,401 B1 | 8/2002 | Clark et al. |
| 6,433,411 B1 | 8/2002 | Degani et al. |
| 6,437,551 B1 | 8/2002 | Krulevitch et al. |
| 6,440,766 B1 | 8/2002 | Clark |
| 6,441,481 B1 | 8/2002 | Karpman |
| 6,443,008 B1 | 9/2002 | Funk et al. |
| 6,444,543 B2 | 9/2002 | Sakai et al. |
| 6,448,109 B1 | 9/2002 | Karpman |
| 6,448,604 B1 | 9/2002 | Funk et al. |
| 6,448,622 B1 | 9/2002 | Franke et al. |
| 6,449,406 B1 | 9/2002 | Fan et al. |
| 6,450,029 B1 | 9/2002 | Sakai et al. |
| 6,460,234 B1 | 10/2002 | Gianchandani |
| 6,462,566 B1 | 10/2002 | Schoefthaler et al. |
| 6,463,803 B2 | 10/2002 | Fujii et al. |
| 6,465,281 B1 | 10/2002 | Xu et al. |
| 6,472,290 B2 | 10/2002 | Cho et al. |
| 6,477,901 B1 | 11/2002 | Tadigadapa et al. |
| 6,483,957 B1 | 11/2002 | Hamerly et al. |
| 6,495,389 B2 | 12/2002 | Ishio et al. |
| 6,507,044 B1 | 1/2003 | Santana, Jr. et al. |
| 6,507,082 B2 | 1/2003 | Thomas |
| 6,508,124 B1 | 1/2003 | Zerbini et al. |
| 6,508,126 B2 | 1/2003 | Sakai et al. |
| 6,508,561 B1 | 1/2003 | Alie et al. |
| 6,512,255 B2 | 1/2003 | Aoki et al. |
| 6,521,508 B1 | 2/2003 | Cheong et al. |
| 6,521,965 B1 | 2/2003 | Lutz |
| 6,522,052 B2 | 2/2003 | Kihara et al. |
| 6,524,890 B2 | 2/2003 | Ueda et al. |
| 6,531,767 B2 | 3/2003 | Shrauger |
| 6,534,340 B1 | 3/2003 | Karpman et al. |
| 6,550,331 B2 | 4/2003 | Fujii et al. |
| 6,550,339 B1 | 4/2003 | Toyoda et al. |
| 6,551,853 B2 | 4/2003 | Toyoda |
| 6,552,404 B1 | 4/2003 | Hynes et al. |
| 6,555,417 B2 | 4/2003 | Spooner et al. |
| 6,555,901 B1 | 4/2003 | Yoshihara et al. |
| 6,555,904 B1 | 4/2003 | Karpman |
| 6,558,976 B2 | 5/2003 | Shrauger |
| 6,568,267 B2 | 5/2003 | Chida et al. |
| 6,569,754 B2 | 5/2003 | Wong et al. |
| 6,621,134 B1 | 9/2003 | Zurn |
| 6,808,954 B2 | 10/2004 | Ma et al. |
| 2001/0001931 A1 | 5/2001 | Fujii et al. |
| 2001/0009110 A1 | 7/2001 | Tmai |
| 2001/0013630 A1 | 8/2001 | Cho et al. |
| 2001/0034076 A1 | 10/2001 | Martin |
| 2001/0045127 A1 | 11/2001 | Chida et al. |
| 2002/0081824 A1 | 6/2002 | Dolan et al. |
| 2002/0118850 A1 | 8/2002 | Yeh et al. |
| 2002/0123211 A1 | 9/2002 | Dolan et al. |
| 2002/0127760 A1 | 9/2002 | Yeh et al. |
| 2002/0135047 A1 | 9/2002 | Funk et al. |
| 2002/0164111 A1 | 11/2002 | Mirza |
| 2002/0177252 A1 | 11/2002 | Muto et al. |
| 2004/0016989 A1 | 1/2004 | Ma et al. |
| 2004/0065932 A1 | 4/2004 | Reichenbach et al. |

OTHER PUBLICATIONS

"Localized Silicon Fusion and Eutectic Bonding for MEMS Fabrication and Packaging", Cheng et al., Journal of Microelectromechanical Systems, vol. 9, No. 1, Mar. 2000, pp. 3–8.

"Localized Bonding with PSG or Indium Solder as Intermediate Layer", Cheng et al., MEMS 1999, $12^{th}$ IEEE International Conference, pp. 285–289.

"Vacuum encapsulation of resonant devices using permeable polysilicon," Lebouitz et al., Micro Electro Mechanical Systems, IEEE International Conference, Jan. 1999, pp. 470–475.

"Electrical and optical characteristics of vacuum–sealed polysilicon microlamps", Mastrangelo et al., IEEE Transactions on Electron Devices, v.39, No. 6, Jun. 1992, pp. 1363–1375.

"Vacuum–sealed silicon micromachined incandescent light source", Mastrangelo et al., IEDM, 1989, pp. 503–506.

"Sealing of Micromachined Cavities Using Chemical Vapor Deposition Methods: Characterization and Optimization", Liu and Tai, IEEE Journal of Microelectromechanical Systems, vol. 8, No. 2, Jun. 1999, pp. 135–145.

"Vacuum Packaging Technology Using Localized Aluminum/Silicon–to–Glass Bonding", Cheng et al., IEEE Journal of Microelectromechanical Systems, vol. 11, No. 5, Oct. 2002, pp. 556–565.

"Novel Process for a Monolithic Integrated Accelerometer", Offenberg et al., The $8^{th}$ International Conference on Solid–State Sensors and Actuators, and Eurosensors IX, Stockholm, Sweden, Jun. 25–29, 1995, pp. 589–592.

"An Integrated Wafer–Scale Packaging Process for MEMS", Kenny et al., Proceedings of IMECE2002, ASME International Mechanical Engineering Congress & Exposition, Nov. 17–22, 2002, New Orleans, Lousiana, pp. 51–54.

"Polysilicon Vibrating Gyroscope Vacuum–Encapsulated in an on–chip Micro Chamber", Tsuchiya et al., Sensors and Actuators A 90 (2001), pp. 49–55.

"New Thin Film Epitaxial Polysilicon Encapsulation for Piezoresistive Accelerometers", Partridge et al., IEEE, 2001, pp. 54–59.

"A Low–Temperature Bi–CMOS Compatible Process for MEMS RF Resonators and Filters", Lund et al., Solid–State Sensor, Actuator and Microsystems Workshop, Hilton Head Island, South Carolina, Jun. 2–6, 2002, pp. 38–41.

"Wafer Scale Encapsulation of a High–Q Micromechanical Resonator", Candler et al., Hilton Head, Open Poster, 2002.

"Permeable Polysilicon Etch–Access Windows for Microshell Fabrication", Lebouitz K S et al., International Conference on Solid–State Sensors and Actuators and Eurosensors, Jun. 25, 1995, pp. 224–227.

"Porous Polycrystalline Silicon: A New Material for MEMS", Anderson R C et al., Journal of Microelectromechanical Systems, Mar. 1994, USA, vol. 3, No. 1, pp. 10–18.

"Vacuum Encapsulation of Resonant Devices Using Permeable Polysilicon", Lebouitz et al., 1999 IEEE, pp. 470–475.

"Laterally Grown Porous Polycrystalline Silicon: A New Material for Transducer Applications", Anderson et al., 1991, IEEE, pp. 747–750.

* cited by examiner

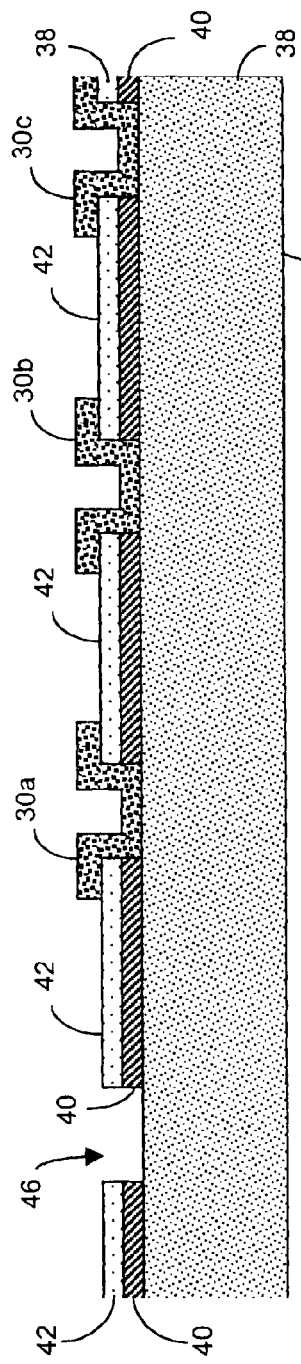
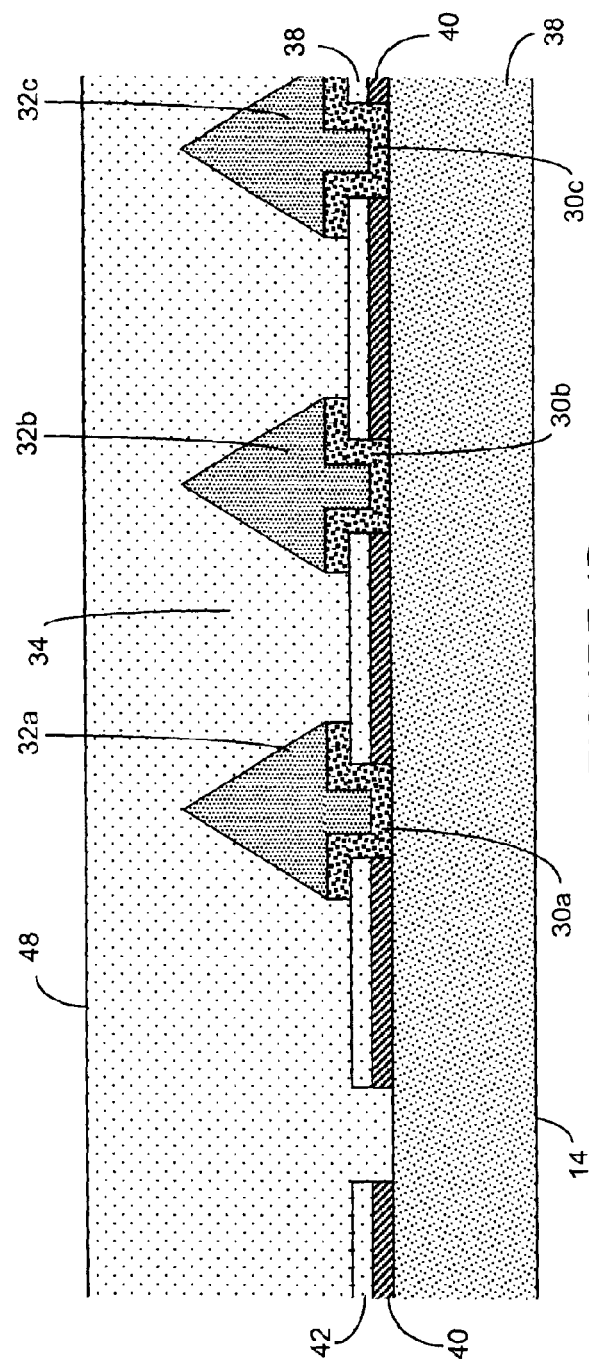
FIGURE 4C
FIGURE 4D

ANCHORS FOR MICROELECTROMECHANICAL SYSTEMS HAVING AN SOI SUBSTRATE, AND METHOD OF FABRICATING SAME

This invention relates to electromechanical systems and techniques for fabricating microelectromechanical and nanoelectromechanical systems; and more particularly, in one aspect, to fabricating or manufacturing for anchoring microelectromechanical and nanoelectromechanical devices to semiconductor on insulator ("SOI") substrates or the like.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics.

MEMS typically include a mechanical structure fabricated from or on, for example, a silicon substrate using micromachining techniques. The silicon substrate is disposed on an insulation layer that, among other things, serves as a sacrificial layer for the MEMS. As such, significant portions of the insulation layer are etched or removed in order to release the mechanical structure. (See, for example, U.S. Pat. Nos. 6,450,029 and 6,240,782). In this way, the mechanical structure may function, for example, as a resonator, accelerometer, gyroscope or other transducer (for example, pressure sensor, strain sensor, tactile sensor, magnetic sensor and/or temperature sensor).

Conventional MEMS also employ the insulation layer to anchor the mechanical structure to the substrate disposed below the insulation layer. (See, for example, U.S. Pat. No. 6,240,782 and U.S. Patent Application Publications 2002/0177252 and 2002/0118850). As such, when fabricating such MEMS, the removal of the insulation layer is tightly controlled to avoid over-etching the insulation layer and thereby adversely impacting that portion of the insulation layer which anchors the mechanical structure to the substrate. In addition, such MEMS tend to include anchors having larger than necessary features to secure the mechanical structures which are fabricated with large tolerances to ensure sufficient anchoring of the mechanical structure under "foreseeable" variations in processing conditions.

Another technique for anchoring mechanical structure to the substrate employs creating or etching a deep trench in the exposed silicon (i.e., the silicon in which the mechanical structure is fabricated on or in) and the insulation layer underlying that silicon. The deep trench contacts the silicon layer that underlies the insulation layer of the wafer. Thereafter, the trench is filled with a low stress silicon nitride that is relatively unaffected during the release of the mechanical structures. (See, for example, U.S. Pat. No. 6,569,754).

Anchoring techniques that employ deep trenches tend to be time consuming and expensive to manufacture as a result of creating the trenches in the thick silicon layer and underlying insulation layer. In addition, such techniques often experience difficulty in adequately filling the deep trenches with a low stress material and, as such, tend to experience the debilitating affects caused by pinholes, for example, cracking and contamination.

There is a need for, among other things, MEMS (for example, gyroscopes, resonators, temperature sensors and/or accelerometers) that overcome one, some or all of the shortcomings of the conventional anchors and anchoring techniques. In this regard, there is a need for an improved technique to adequately anchor the mechanical structure in a cost efficient manner that avoids the need for large tolerances and very tightly controlled etching and re-fill or deposition techniques experienced when using the conventional techniques.

SUMMARY OF THE INVENTION

There are many inventions described and illustrated herein. In a first principal aspect, the present invention is a method of manufacturing an electromechanical device having a mechanical structure including a fixed electrode. The electromechanical device includes a substrate, an insulation layer disposed on the substrate, and a first semiconductor layer disposed on the insulation layer. The method comprises removing first portions of the first semiconductor and insulation layer to thereby a portion of the substrate and form an anchor opening. An anchor material (for example, silicon, silicon nitride, silicon carbide, germanium, silicon/germanium or gallium arsenide) may be deposited in the opening to form the anchor. In this aspect of the invention, the method includes depositing a second semiconductor layer over the anchor material and forming the fixed electrode from at least the second semiconductor layer that is disposed over the anchor material wherein the fixed electrode is affixed to the substrate via the anchor material.

The method may also include forming a moveable electrode, juxtaposed the fixed electrode including defining the moveable electrode by removing first and second portions of the second semiconductor layer and releasing the moveable electrode by removing the insulation layer underlying the moveable electrode wherein the anchor material is not substantially removed when releasing moveable electrode.

In one embodiment, the insulation layer includes silicon oxide and the anchor material includes silicon, silicon nitride, silicon carbide, germanium, silicon/germanium or gallium arsenide. In another embodiment the insulation layer is comprised of silicon nitride and the anchor material includes silicon, silicon oxide, silicon carbide, germanium, silicon/germanium, or gallium arsenide.

In one embodiment, a substantial portion of the fixed electrode overlying the anchor material is a monocrystalline silicon. In another embodiment, a substantial portion of the fixed electrode overlying the anchor material is a polycrystalline silicon.

In another aspect, the present invention is a method of manufacturing an electromechanical device having a mechanical structure including fixed and moveable electrodes that reside in a chamber. The electromechanical device includes a substrate, an insulation layer disposed on the substrate, and a first semiconductor layer disposed on the insulation layer. The fixed electrode is affixed to the substrate via an anchor material. The method includes removing portions of the first semiconductor and insulation layer to expose a portion of the substrate and thereby form an anchor opening. An anchor material is deposited in the anchor opening and a second semiconductor layer over the anchor material and the first semiconductor layer. The method further includes etching the first and second semiconductor layer to form the fixed and moveable electrodes from the first and second semiconductor layers wherein the fixed electrode includes at least a portion of the second semiconductor layer that is disposed over the anchor material. The anchor material secures the fixed electrode to the substrate.

In addition, the method of this aspect of the invention includes depositing a sacrificial layer over the fixed and moveable electrodes and depositing a first encapsulation layer (for example, polycrystalline silicon, amorphous silicon, silicon carbide, silicon/germanium, germanium, or gallium arsenide) over the sacrificial layer. Vents are formed in the first encapsulation layer to permit release of the moveable electrode by removing the insulation layer underlying the moveable electrode wherein the anchor material is not substantially removed when releasing moveable electrode. Thereafter a second encapsulation layer (for example, polycrystalline silicon, porous polycrystalline silicon, amorphous silicon, silicon carbide, silicon/germanium, germanium or gallium arsenide) may be deposited over or in the vent to seal the vents wherein the second encapsulation layer is a semiconductor material.

In one embodiment, the insulation layer is comprised of silicon oxide and the anchor material includes silicon nitride, silicon carbide, germanium, silicon/germanium or gallium arsenide. In another embodiment, the insulation and sacrificial layers are comprised of silicon oxide and the anchor material includes silicon, silicon carbide, germanium, silicon/germanium or gallium arsenide. In yet another embodiment, the insulation layer is comprised of silicon nitride and the anchor material includes silicon, silicon oxide, silicon carbide, germanium, silicon/germanium or gallium arsenide.

In yet another aspect, the present invention is a method of manufacturing an electromechanical device having a mechanical structure including a contact and fixed and moveable electrodes. The electrodes reside in a chamber of the device. The electromechanical device includes a substrate, an insulation layer disposed on the substrate, and a first semiconductor layer disposed on the insulation layer. The fixed electrode is affixed to the substrate via an anchor material.

The method of this aspect of the invention includes removing portions of the first semiconductor and insulation layer to expose a portion of the substrate and thereby form an anchor opening. An anchor material is deposited in the anchor opening and a second semiconductor layer over the anchor material and the first semiconductor layer. The method further includes etching the first and second semiconductor layer to form the fixed and moveable electrodes from the first and second semiconductor layers wherein the fixed electrode includes at least a portion of the second semiconductor layer that is disposed over the anchor material. The anchor material secures the fixed electrode to the substrate.

The method also includes depositing a sacrificial layer over the fixed and moveable electrodes and depositing a first encapsulation layer (for example, polycrystalline silicon, amorphous silicon, silicon carbide, silicon/germanium, germanium, or gallium arsenide) over the sacrificial layer. Vents are formed in the first encapsulation layer to permit release of the moveable electrode by removing the insulation layer underlying the moveable electrode wherein the anchor material is not substantially removed when releasing moveable electrode. Thereafter a second encapsulation layer (for example, polycrystalline silicon, porous polycrystalline silicon, amorphous silicon, silicon carbide, silicon/germanium, germanium or gallium arsenide) may be deposited over or in the vent to seal the vents wherein the second encapsulation layer is a semiconductor material.

In addition, the method includes forming a trench around at least a portion of the contact (wherein the contact and the trench as disposed outside the chamber) and depositing a first material (for example, silicon oxide and/or silicon nitride) in the trench to electrically isolate the contact. In one embodiment, the trench surrounds the contact.

The method may also include depositing an insulating layer on at least a portion of the trench and, thereafter, depositing a highly conductive material on the contact and over the insulating layer to provide electrical connection to the contact.

The insulation layer may be comprised of silicon oxide and the anchor material includes silicon nitride, silicon carbide, germanium, silicon/germanium or gallium arsenide. In another embodiment, the insulation and sacrificial layers are comprised of silicon oxide and the anchor material includes silicon, silicon carbide, germanium, silicon/germanium or gallium arsenide. The insulation layer may be comprised of silicon nitride and the anchor material includes silicon, silicon oxide, silicon carbide, germanium, silicon/germanium or gallium arsenide.

In one embodiment, a substantial portion of the fixed electrode overlying the anchor material is a monocrystalline silicon. In another embodiment, a substantial portion of the fixed electrode overlying the anchor material is a polycrystalline silicon.

In another aspect, the present invention is an electromechanical device comprising a substrate, an insulation layer disposed on the substrate, and a first semiconductor layer disposed on the insulation layer. The device may further include an anchor that is disposed in an opening in the insulation layer and the first semiconductor layer and contacts the substrate. The anchor includes a material (for example, silicon nitride, silicon carbide, germanium, silicon/germanium or gallium arsenide) that is different than the insulation layer. A second semiconductor layer may be disposed on the anchor wherein a fixed electrode, formed in part from the second semiconductor layer, is affixed to the substrate via the anchor.

The device of this aspect of the invention may also include a moveable electrode, juxtaposed the fixed electrode. The moveable electrode may also be formed, at least in part, from the second semiconductor layer.

In one embodiment, a substantial portion of the fixed electrode overlying the anchor material is monocrystalline silicon. In another embodiment, a substantial portion of the fixed electrode overlying the anchor material is polycrystalline silicon.

The device may also include a chamber including a first encapsulation layer (for example, monocrystalline silicon, polycrystalline silicon, porous polycrystalline silicon, amorphous silicon, germanium, silicon/germanium, gallium arsenide, silicon nitride or silicon carbide) having at least one vent. The moveable electrode may be disposed in the chamber. A second encapsulation layer comprised of a semiconductor material (for example, monocrystalline silicon, polycrystalline silicon, porous polycrystalline silicon, amorphous silicon, silicon carbide, silicon/germanium, germanium or gallium arsenide) may be deposited over or in the vent, to thereby seal the chamber.

In one embodiment, the first encapsulation layer is a semiconductor material that is doped with a first impurity to provide a first region of a first conductivity type. Moreover, the semiconductor material of the second encapsulation layer is doped with a second impurity to provide a second region with a second conductivity type and wherein the first conductivity type is opposite the second conductivity type.

In another aspect, the present invention is an electromechanical device similar to the previous aspect of the invention but also including a contact and a trench, disposed around at least a portion of the contact, including a first material disposed therein to electrically isolate the contact.

The contact and the trench, of this aspect of the invention, are disposed outside the chamber. In one embodiment, the trench is disposed on an etch stop region. The etch stop region may be a silicon oxide or silicon nitride.

Notably, the trench may also include a second material surrounded by the first material and wherein the second material is a semiconductor material.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 4A–4F illustrate cross-sectional views of the fabrication of the microstructure of FIG. 3 at various stages of the process, according to certain aspects of the present invention;

DETAILED DESCRIPTION

There are many inventions described and illustrated herein. In one aspect, the present invention is directed to a MEMS device, and technique of fabricating or manufacturing a MEMS device having anchors to secure the mechanical structures to the substrate. The anchors of the present invention are comprised of a material that is relatively unaffected by the release processes of the mechanical structures. In this regard, the etch release process are selective or preferential to the material(s) securing the mechanical structures in relation to the material comprising the anchors. Moreover, the anchors of the present invention are secured to the substrate in such a manner that removal of the insulation layer has little to no affect on the anchoring of the mechanical structures to the substrate.

Figure 1:
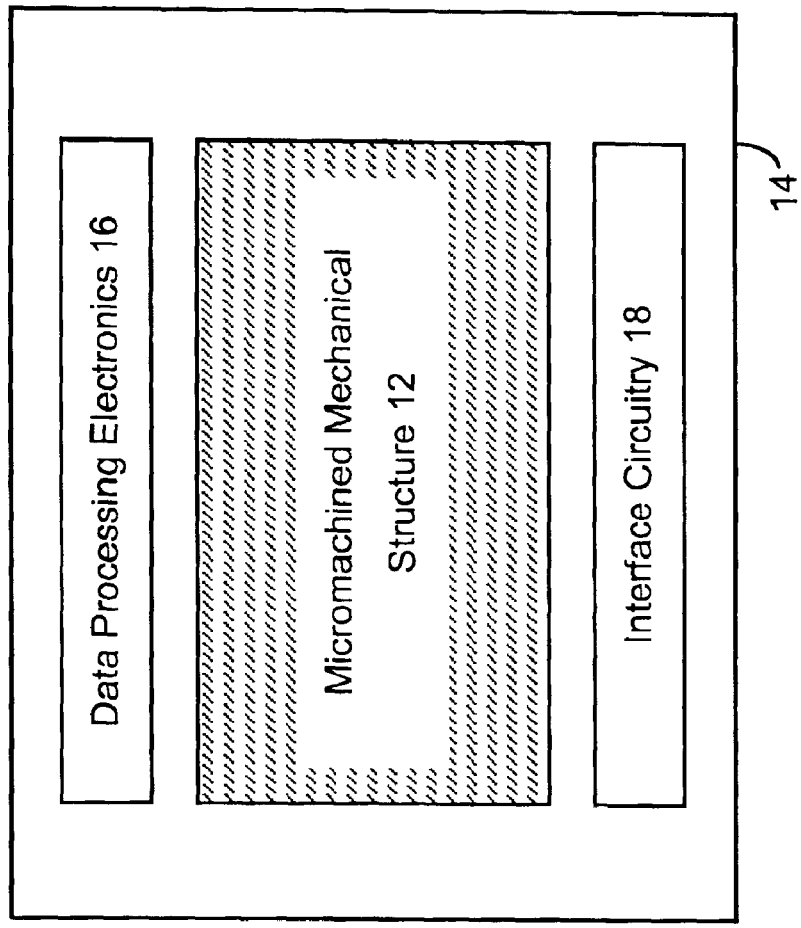
FIG. 1 is a block diagram of microelectromechanical system disposed on a substrate, in conjunction with interface circuitry and data processing electronics.

With reference to FIG. 1, in one exemplary embodiment, MEMS 10 includes micromachined mechanical structure 12 that is disposed on substrate 14, for example, an undoped semiconductor-like material, a glass-like material, or an insulator-like material. The MEMS 10 may also include data processing electronics 16 to process and analyze information generated by, and/or control or monitor the operation of micromachined mechanical structure 12. In addition, MEMS 10 may also include interface circuitry 18 to provide information from micromachined mechanical structure 12 and/or data processing electronics 16 to an external device (not illustrated), for example, a computer, indicator/display and/or sensor.

The data processing electronics 16 and/or interface circuitry 18 may be integrated in or on substrate 14. In this regard, MEMS 10 may be a monolithic structure including mechanical structure 12, data processing electronics 16 and interface circuitry 18. The data processing electronics 16 and/or interface circuitry 18 may also reside on a separate, discrete substrate that, after fabrication, is bonded to or on substrate 14.

Figure 2:
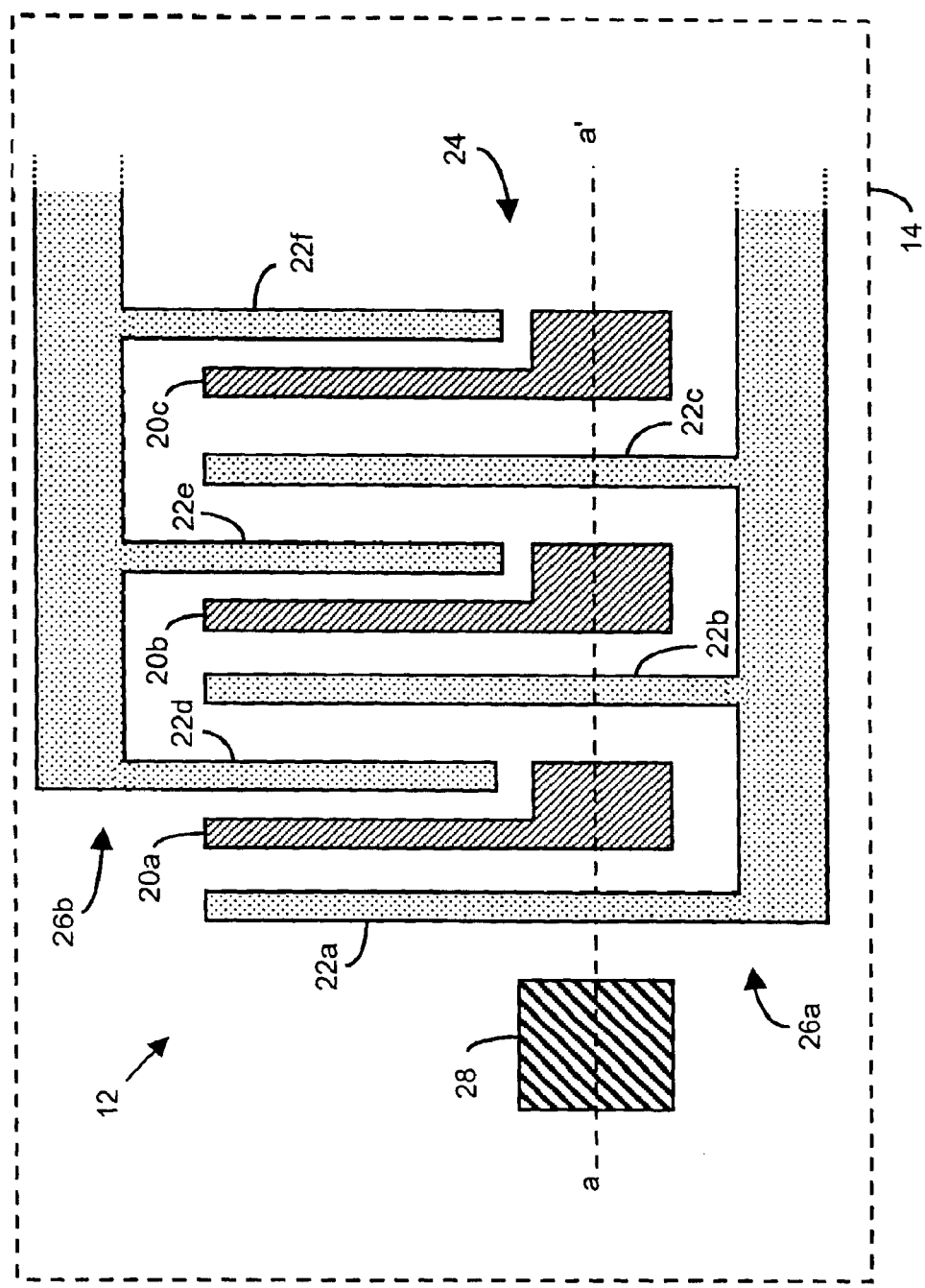
FIG. 2 illustrates a top view of a portion of micromechanical structure, for example, a portion of an interdigitated or comb-like finger electrode array, having "moveable" electrodes and "fixed" electrodes, of an accelerometer, in conjunction with a contact area.

With reference to FIG. 2, in one embodiment, micromachined mechanical structure 12 includes mechanical structures 20a–c and 22a–f disposed on, above and/or in substrate 14. In particular, mechanical structures 20a–c may be "fixed" electrodes of "fixed" mechanical member 24. The mechanical structures 22a–c may be "moveable" electrodes of "moveable" mechanical member 26a and mechanical structures 22d–f may be "moveable" electrodes of "moveable" mechanical member 26b.

The mechanical structures 20a–c and 22a–f may be comprised of, for example, materials in column IV of the periodic table, for example silicon, germanium, carbon; also combinations of these, for example silicon germanium, or silicon carbide; also of III–V compounds for example gallium phosphide, aluminum gallium phosphide, or other III–V combinations; also combinations of II, IV, V, or VI materials, for example silicon nitride, silicon oxide, aluminum carbide, or aluminum oxide; also metallic suicides, germanides, and carbides, for example nickel silicide, cobalt silicide, tungsten carbide, or platinum germanium silicide;

also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Notably, mechanical structures 20a–c and 22a–f may be a portion of an accelerometer, gyroscope or other transducer (for example, pressure sensor, strain sensor, tactile sensor, magnetic sensor and/or temperature sensor), filter or resonator. The micromachined mechanical structure 12 may also include mechanical structures of a plurality of transducers or sensors including one or more accelerometers, gyroscopes, pressure sensors, tactile sensors and temperature sensors. Where micromachined mechanical structure 12 is an accelerometer, mechanical structures 20a–c and 22a–f may be a portion of the interdigitated or comb-like finger electrode arrays that comprise the sensing features of the accelerometer (see, for example, U.S. Pat. No. 6,122,964).

With continued reference to FIG. 2, micromachined mechanical structure 12 may also include a contact area 28 disposed on or in substrate 14. The contact area 28 may provide an electrical path between micromachined mechanical structure 12 and data processing electronics 16, interface circuitry 18 and/or an external device (not illustrated). The contact area 24 may be comprised of, for example, silicon, (whether doped or undoped), germanium, silicon/germanium, silicon carbide, and gallium arsenide, and combinations and/or permutations thereof.

Figure 3:
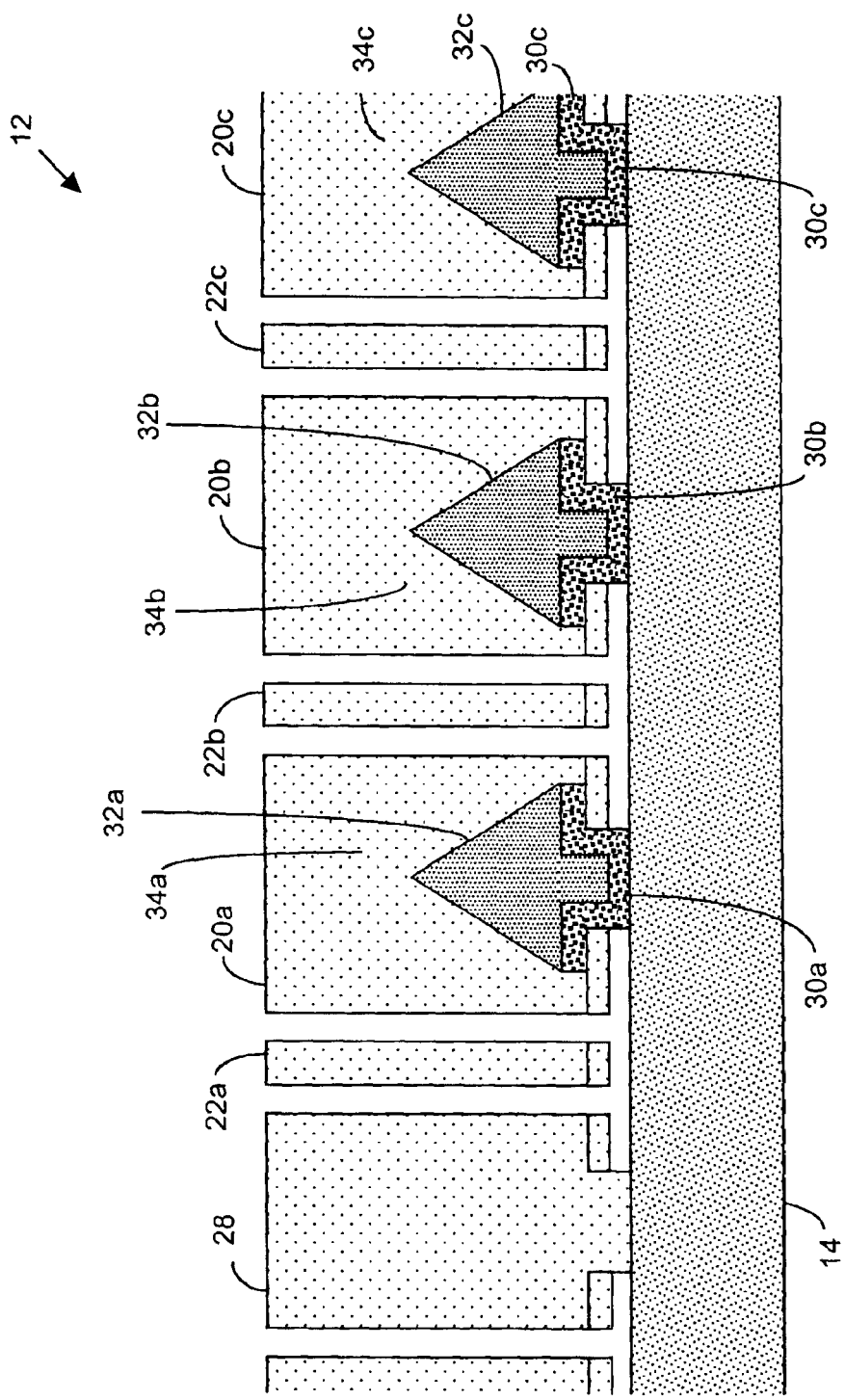
FIG. 3 illustrates a cross-sectional view (sectioned along dotted line a—a of FIG. 2) of the portion of the interdigitated or comb-like finger electrode array and contact area of FIG. 2, in accordance with certain aspects of the present invention.

FIG. 3 illustrates a cross-sectional view of micromachined mechanical structure 12, including mechanical structures 20a–c and 22a–f, along dotted line a—a', in accordance with one embodiment of the present invention. The mechanical structures 20a–c are affixed to substrate 14 via anchors 30a–c, respectively. In one embodiment, each mechanical structure 20a–c is comprised of first crystalline portion 32a–c (for example, a polycrystalline portion) 32a–c, respectively, and second crystalline portion (for example, monocrystalline portion) 34a–c, respectively.

The anchors 30a–c may be comprised of, for example, one or more material(s) that are relatively unaffected by the process(es) for releasing the mechanical structures. In this regard, the etch release process(es) are selective and, as such, the material comprising anchors 30a–c are not substantially etched (or etched at all) relative to the material securing or surrounding mechanical structures 20a–c and 22a–f.

The anchors 30a–c are disposed on, or secured to, substrate 14 in such a manner that removal of the insulation layer of the SOI substrate has little to no affect on the anchoring of mechanical structures 20a–c and 22a–f to substrate 14.

In one embodiment, anchors 30a–c may be silicon, silicon nitride, silicon carbide, and/or germanium, silicon/germanium, and gallium arsenide (and combinations thereof). Indeed, in those instances where the insulation material of the SOI substrate is other than the common silicon oxide (for example, the sacrificial layer of the SOI substrate is a silicon nitride), anchors 30a–c may be silicon oxide provided that silicon oxide is relatively unaffected by the process(es) of releasing the mechanical structures.

The anchors 30a–c may be deposited, formed and/or grown using, for example, a low pressure ("LP") chemically vapor deposited ("CVD") process (in a tube or EPI reactor), plasma enhanced ("PE") CVD process, or an atmospheric pressure ("AP") CVD process. Indeed, all deposition techniques, for depositing anchors 30a–c, whether now known or later developed, are intended to be within the scope of the present invention.

With continued reference to FIG. 3, in one embodiment, mechanical structures 20a–c are comprised of polycrystalline portion 32a–c and monocrystalline portion 34a–c. The materials and/or surfaces, as well as the techniques employed to deposit, form and/or grow mechanical structures 20a–c, may determine the crystalline structure of the underlying material. For example, in an epitaxial environment having a predetermined set of parameters, the monocrystalline portion of mechanical structures 20a–c will deposit, form and/or grow in an "advancing" manner and, as such polycrystalline portion 32a–c will deposit, form and/or grow in a "retreating" manner. In contrast, with another predetermined set of parameters, monocrystalline portion 34a–c of mechanical structures 20a–c will deposit, form and/or grow in a "retreating" manner and, as such, polycrystalline portion 32a–c will deposit, from and/or grow in an "advancing" manner (see, FIG. 5). The structures and portions thereof may be deposited, formed and/or grown in these or other manners and, as such, all deposition techniques for and crystalline structures of mechanical structures 20a–c, whether now known or later developed, are intended to be within the scope of the present invention.

Figure 4A:
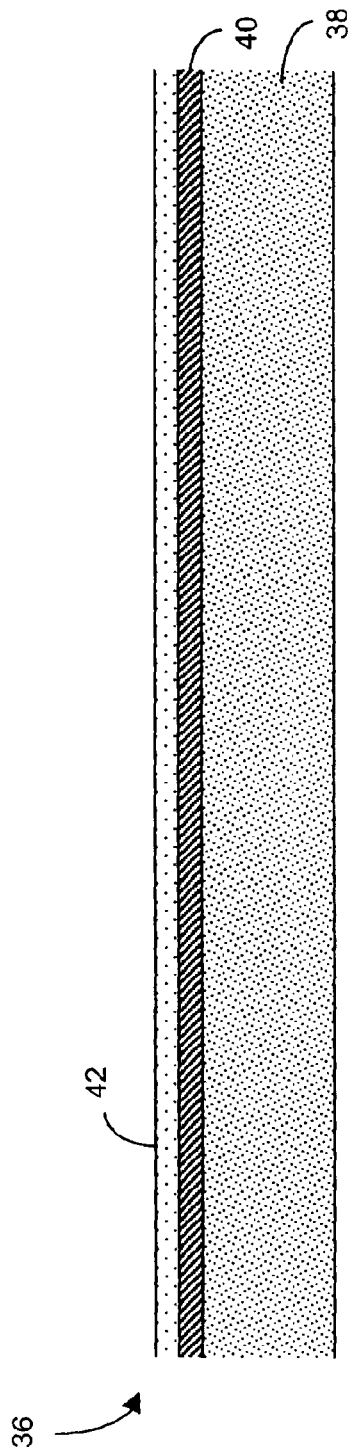

With reference to FIG. 4A, the MEMS 10 is formed in or on SOI substrate 36. The SOI substrate 36 includes first substrate layer 38 (for example, a semiconductor (such as silicon), glass or sapphire), insulation layer 40 and first semiconductor layer 42. In one embodiment, SOI substrate 36 is a SIMOX wafer. Where SOI substrate 36 is a SIMOX wafer such wafer may be fabricated using well-known techniques including those disclosed, mentioned or referenced in U.S. Pat. Nos. 5,053,627; 5,080,730; 5,196,355; 5,288,650; 6,248,642; 6,417,078; 6,423,975; and 6,433,342 and U.S. Published Patent Applications 2002/0081824 and 2002/0123211, the contents of which are hereby incorporated by reference.

In another embodiment, SOI substrate 36 may be a conventional SOI wafer having a relatively thin first semiconductor layer 42. In this regard, SOI substrate 36 having a relatively thin first semiconductor layer 42 may be fabricated using a bulk silicon wafer which is implanted and oxidized by oxygen to thereby form a relatively thin $SiO_2$ underneath the single or mono crystalline wafer surface. In this embodiment, first semiconductor layer 42 (i.e., monocrystalline silicon) is disposed on insulation layer 40 (i.e. silicon dioxide), having a thickness of approximately 350 nm, which is disposed on a first substrate layer 38 (i.e., monocrystalline silicon), having a thickness of approximately 190 nm.

Notably, all techniques for providing or fabricating SOI substrate 36, whether now known or later developed, are intended to be within the scope of the present invention.

Figure 4B:
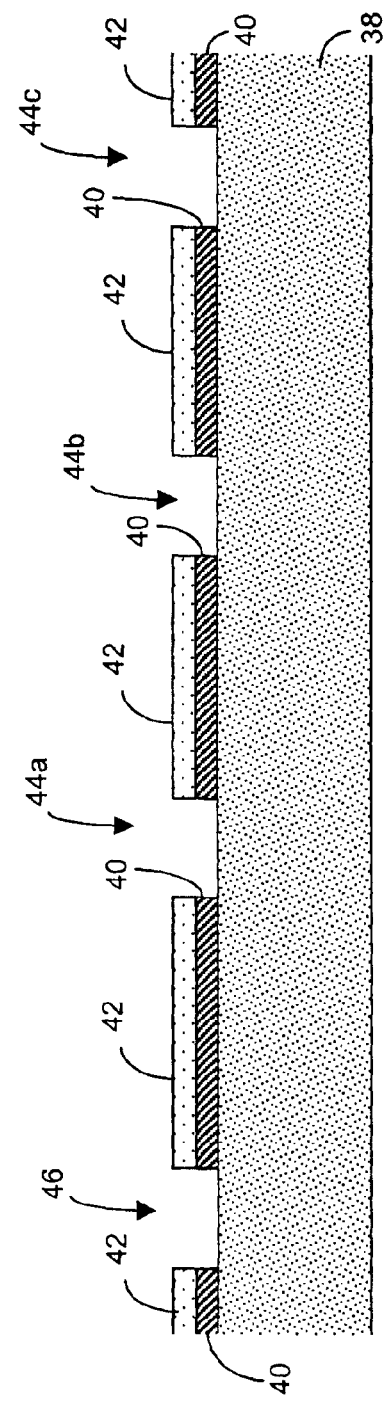

With reference to FIGS. 4B and 4C, an exemplary method of fabricating or manufacturing a micromachined mechanical structure 12 according to the present invention may begin with forming anchor openings 44a–c and contact opening 46 in insulation layer 40 and first semiconductor layer 42 using well-known lithographic and etching techniques. In this way, selected portions of first semiconductor layer 40 are exposed to facilitate contact thereto. Thereafter, anchors 30a–c are formed in anchor openings 44a–c using well-known deposition and lithographic techniques. As mentioned above, anchors 30a–c may be comprised of, for example, one or more material(s) that relatively unaffected by the process of releasing the mechanical structures. In this regard, the material is selective relative to the etch release process. Accordingly, anchors 30a–c are disposed on, or secured to, substrate 14 in such a manner that removal of portions of insulation layer 40 near anchors 30a–c (during releases processes of mechanical structures 20a–c and 22a–f).

With reference to FIG. 4D, active layer 48 may be deposited, formed and/or grown on anchors 30a–c, insulation layer 40 and any exposed portion(s) of first substrate layer 38 (see, for example, contact opening 46 in FIG. 4C). The mechanical structures 20a–c and 22a–f are formed from active layer 48. The active layer 48 may be deposited, formed and/or grown using well-known techniques and from those materials (for example, semiconductors such as silicon, germanium, silicon-germanium or gallium-arsenide) described above with respect to mechanical structures 20a–c and 22a–f. In this embodiment, the monocrystalline portion 34 of active layer 48 is formed and/or grown in an "advancing" manner and, as such polycrystalline portion 32a–c is formed and/or grown in a "retreating" manner.

Figure 4E:
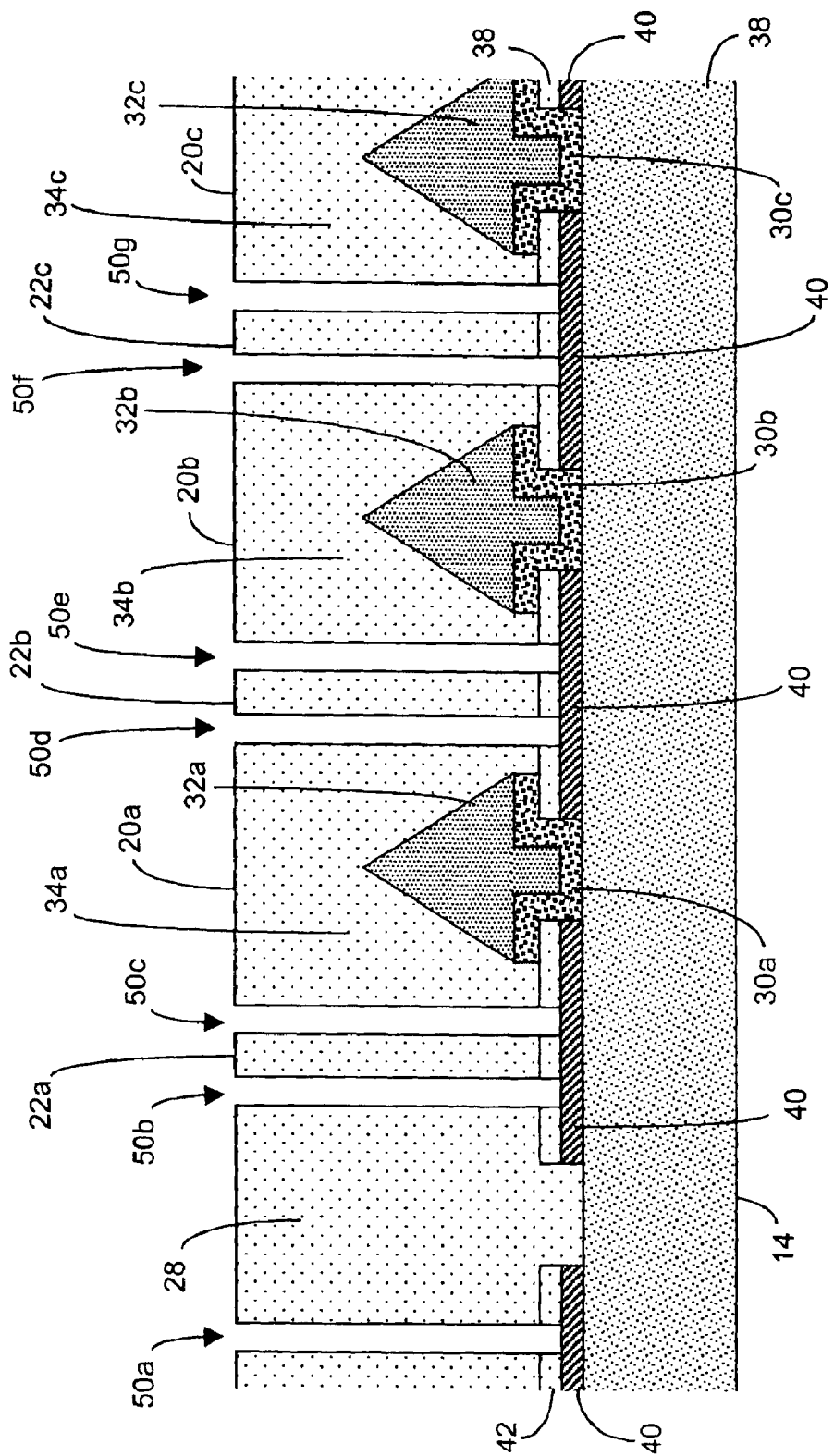

Thereafter, with reference to FIG. 4E, mechanical structures 20a–c and 22a–f, and contact area 28 may be formed using well-known lithographic and etching techniques. In this regard, trenches 50a–g are formed in active layer 48. In one embodiment, insulation layer 40 acts or functions as an etch stop during the formation of trenches 50a–g. Notably, all techniques for forming or fabricating trenches 50a–g, whether now known or later developed, are intended to be within the scope of the present invention.

Figure 4F:
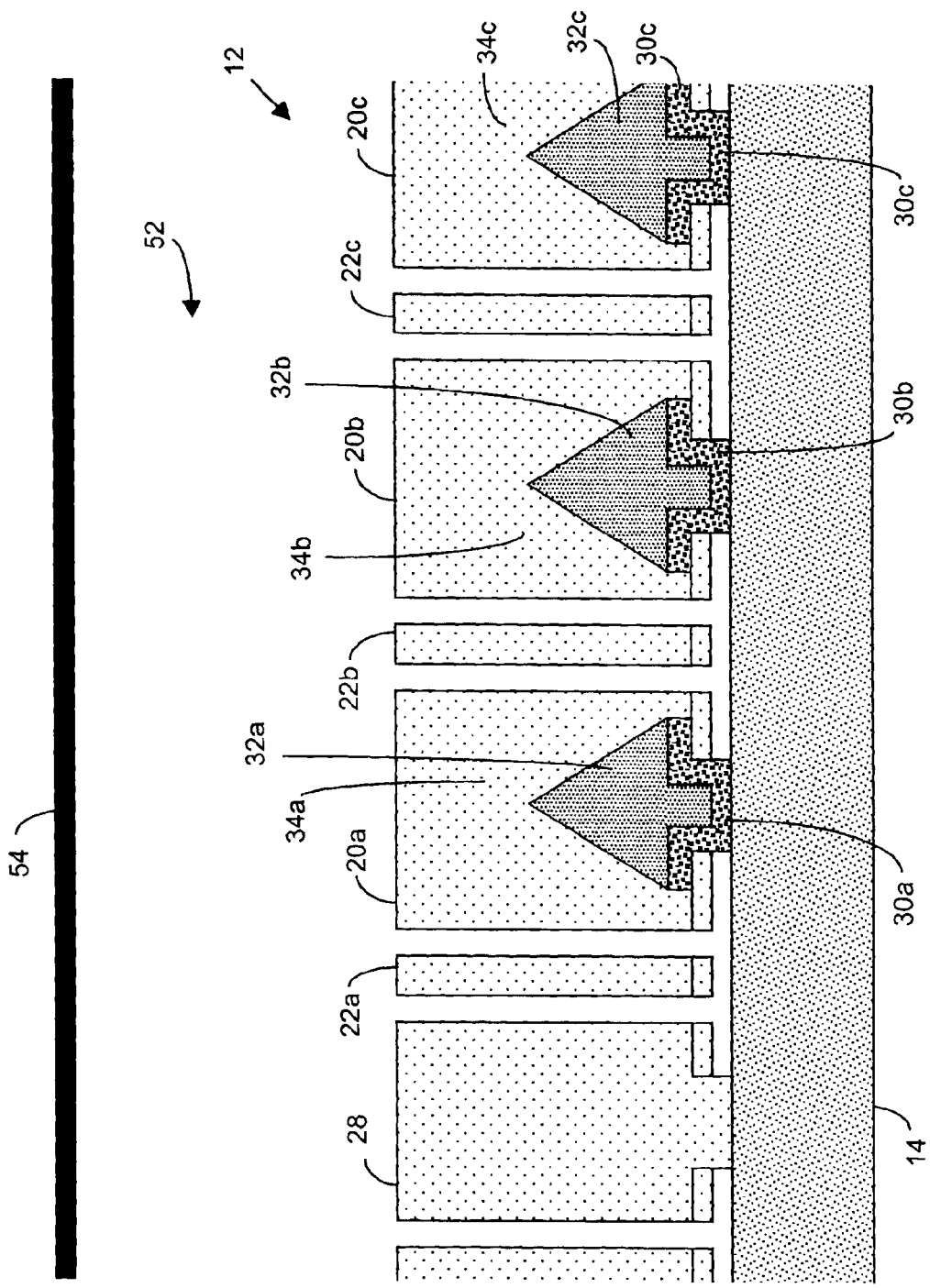

The trenches 50a–g, in addition to defining the features of mechanical structures 20a–c and 22a–f, may also permit etching and/or removal of at least selected portions of insulation layer 40. With reference to FIG. 4F, using well-known etching techniques and materials, insulation layer 40 is etched or removed to release mechanical structures 20a–c and 22a–f. For example, in one embodiment, where insulation layer 40 is comprised of silicon dioxide, selected portions may be removed/etched using well-known wet etching techniques and buffered HF mixtures (i.e., a buffered oxide etch) or well-known vapor etching techniques using vapor HF. Proper design of mechanical structures 20a–d and control of the HF etching process parameters may permit insulation layer 40 to be sufficiently removed or etched to release mechanical structures 20a–c and 22a–f and permit proper operation of MEMS 10.

In another embodiment, where insulation layer 40 is comprised of silicon nitride, selected portions may be removed/etched using phosphoric acid. Again, proper design of mechanical structures 20a–c and 22a–f, and control of the wet etching process parameters, may permit insulation layer 40 to be sufficiently etched which will release mechanical structures 20a–c and 22a–f.

It should be noted that there are: (1) many suitable materials for insulation layer 40 (for example, silicon dioxide, silicon nitride, and doped and undoped glass-like materials, e.g., phosphosilicate ("PSG") or borophosphosilicate ("BPSG")) and spin on glass ("SOG")), (2) many suitable/associated etchants (for example, a buffered oxide etch, phosphoric acid, and alkali hydroxides such as, for example, NaOH and KOH), and (3) many suitable etching or removal techniques (for example, wet, plasma, vapor or dry etching), to eliminate, remove and/or etch insulation layer 40. Accordingly, all materials, etchants and etch techniques, and permutations thereof, for eliminating, removing and/or etching, whether now known or later developed, are intended to be within the scope of the present invention.

As mentioned above, anchors 30a–c remain relatively unaffected by the removal of insulation layer 40. In this regard, the etch or removal process is selective to insulation layer 40. In those instances where anchors 30a–c are etched during the removal or etching of insulation layer 40, it may be advantageous to select materials that provide a significant etch selectively ratio (for example, greater than 10:1, 25:1 or 50:1, and preferably greater than 100:1) and/or to appropriately time the etch so that anchors 30a–c are not substantially affected. In this way, anchors 30a–c may provide the anchoring requirements of mechanical structures 20a–c.

The MEMS 10 may be sealed in chamber 52 using conventional encapsulation techniques and structures. With continued reference to FIG. 4F, in one embodiment, MEMS 10 is encapsulated using, for example, cap 52 (a semiconductor or glass-like substrate) that is bonded to substrate 14. Other packaging techniques are also suitable (for example, a TO-8 "can"). Indeed, all encapsulation techniques, whether now known or later developed, are intended to be within the scope of the present invention.

For example, the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"), may be employed in conjunction with the anchors and anchoring techniques described and illustrated herein. For the sake of brevity, the inventions described and illustrated in the Microelectromechanical Systems and Method of Encapsulating Patent Application, implemented in conjunction with the inventions described and illustrated herein, will not be repeated but will only be summarized. It is expressly noted, however, that the entire contents of the Microelectromechanical Systems and Method of Encapsulating Patent Application, including for example, the features, attributes, alternatives, materials, techniques and advantages of all of the inventions, are incorporated by reference herein.

Figure 6:
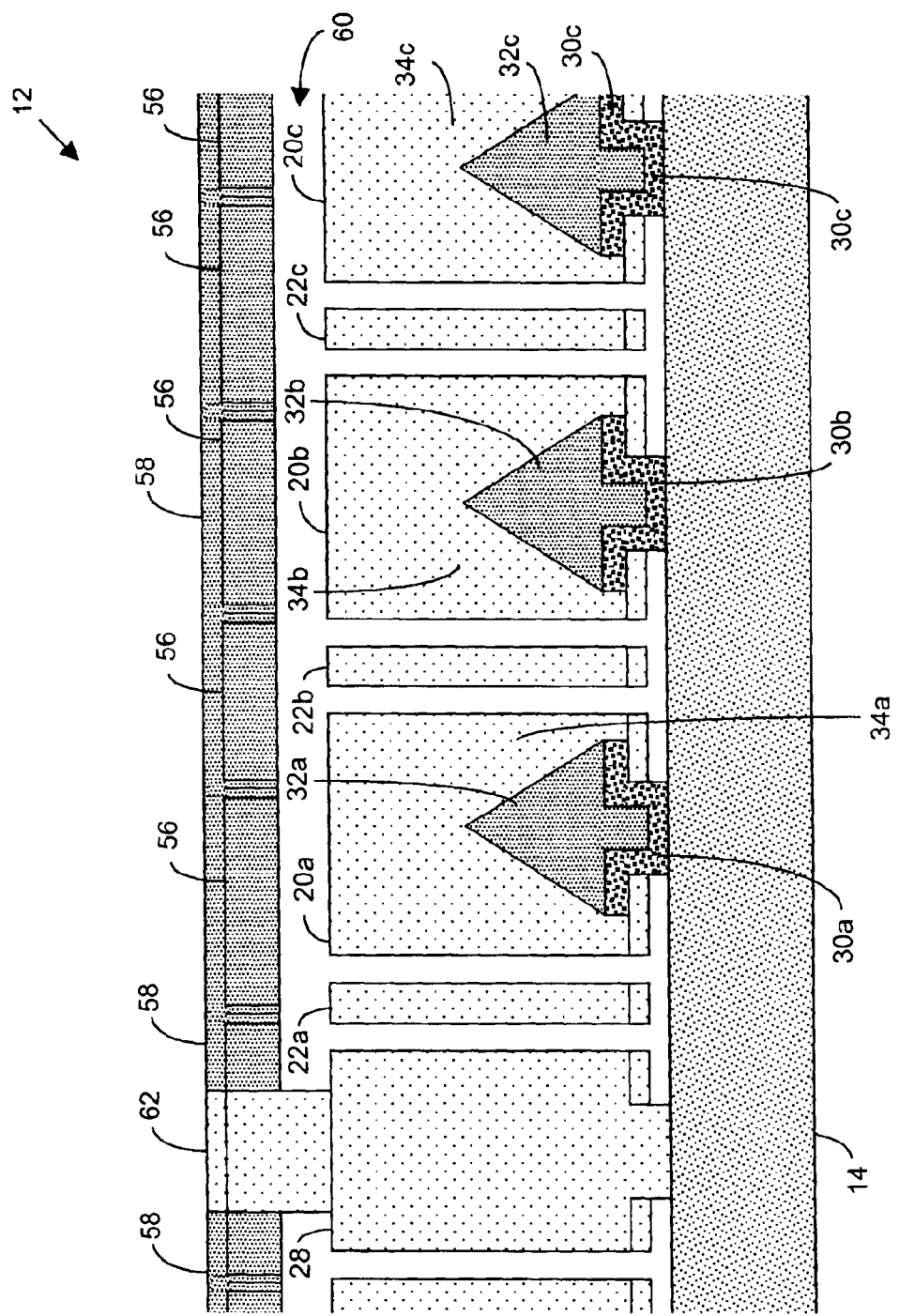
FIG. 6 illustrates a cross-sectional view (sectioned along dotted line a—a of FIG. 2) of the portion of the interdigitated or comb-like finger electrode array and contact area of FIG. 2, in accordance with certain aspects of the present invention.

Briefly, with reference to FIG. 6, micromachined mechanical structure 12 includes mechanical structures 20a–c, anchored in the manner as described above, mechanical structures 22a–f, and contact area 28. In addition, first and second encapsulation layers 56 and 58, respectively, may seal chamber 60 using any of the techniques, materials or embodiments described in the Microelectromechanical Systems and Method of Encapsulating Patent Application. Further, contact via 62 provides electrical access to contact 28.

Figure 7A:
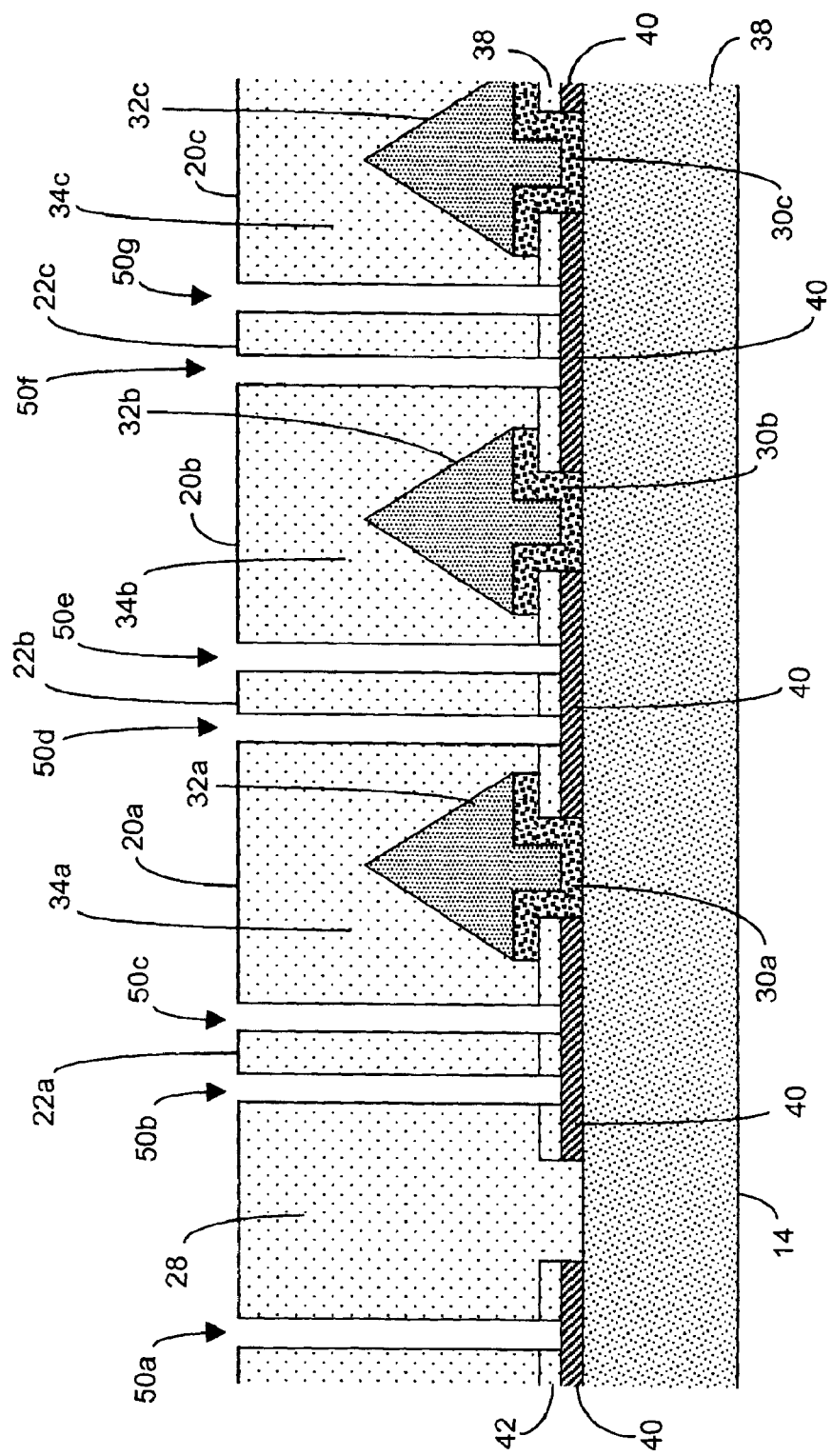
FIGS. 7A–7G illustrate cross-sectional views of the fabrication of the microstructure of FIG. 6 at various stages of the process, according to certain aspects of the present invention.
Figure 7B:
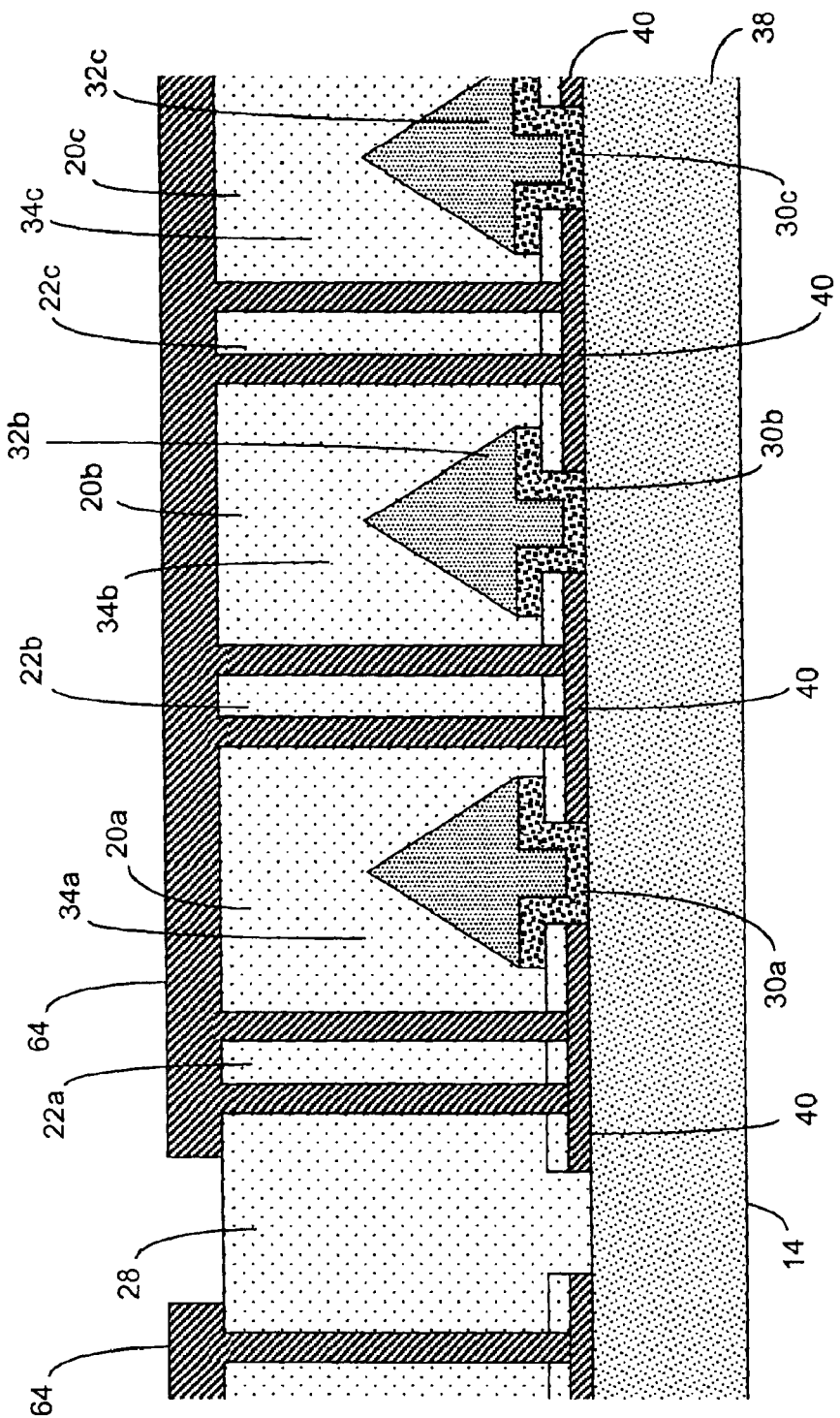

In particular, with reference to FIGS. 7A and 7B, an exemplary method of fabricating or manufacturing a micromachined mechanical structure 12 using the encapsulation techniques of Microelectromechanical Systems and Method of Encapsulating Patent Application may begin with a partially formed device including mechanical structures 20a–c, anchored in the manner as described above, mechanical structures 22a–f, and contact area 28 (see, FIG. 7A). Thereafter, sacrificial layer 64 may be deposited and patterned to expose a portion of the contact area 28 to facilitate electrical connection thereto (see, FIG. 7B).

Figure 7C:
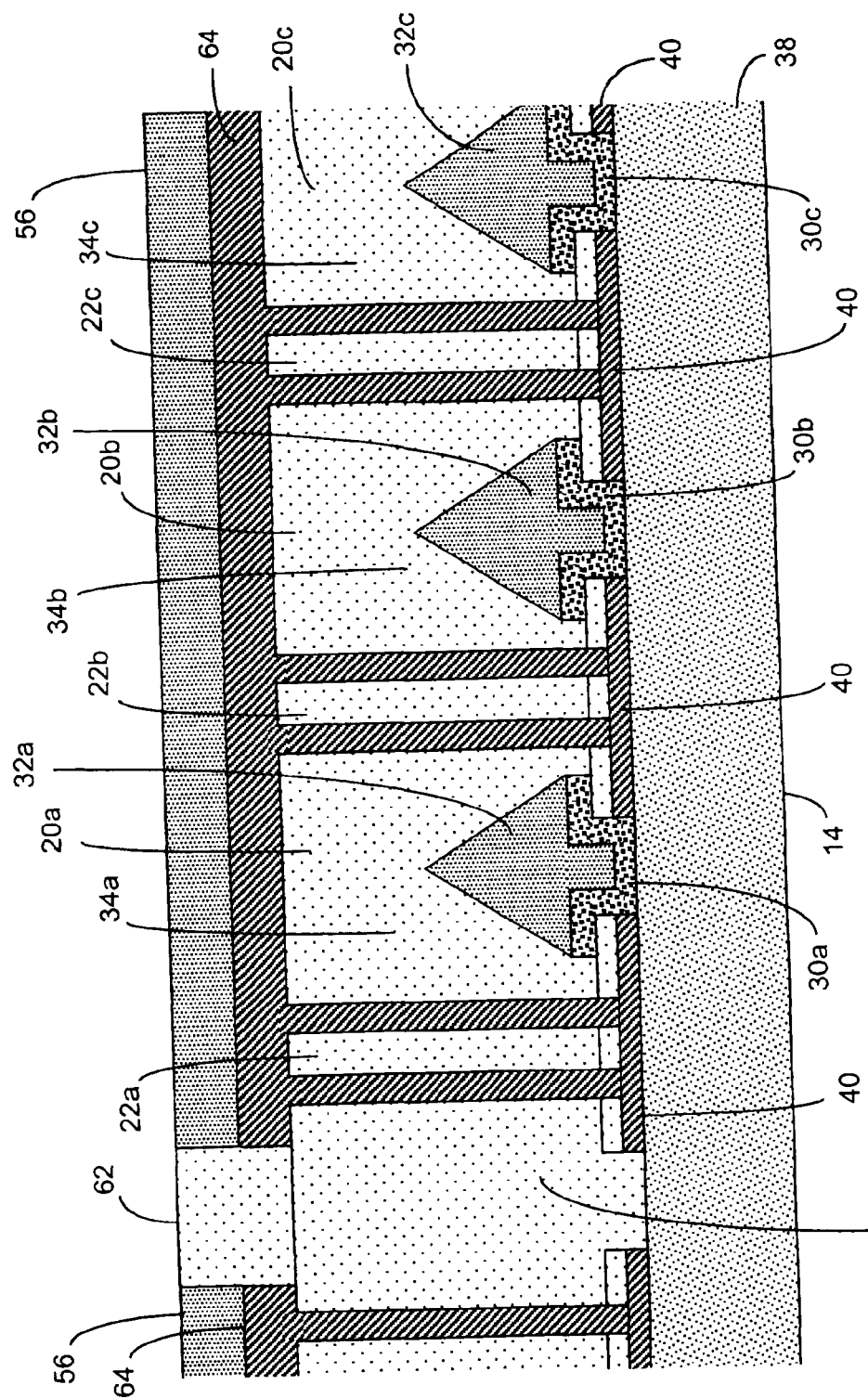

With reference to FIG. 7C, after deposition of sacrificial layer 64, first encapsulation layer 56 may be deposited, formed and/or grown. The first encapsulation layer 56 may be, for example, a silicon-based material (for example, silicon/germanium, silicon carbide, monocrystalline silicon, polycrystalline silicon or amorphous silicon, whether doped or undoped), germanium, and gallium arsenide (and combinations thereof), which is deposited and/or formed using, for example, an epitaxial, a sputtering or a CVD-based reactor (for example, APCVD, LPCVD, or PECVD). The deposition, formation and/or growth may be by a conformal process or non-conformal process.

Figure 7D:
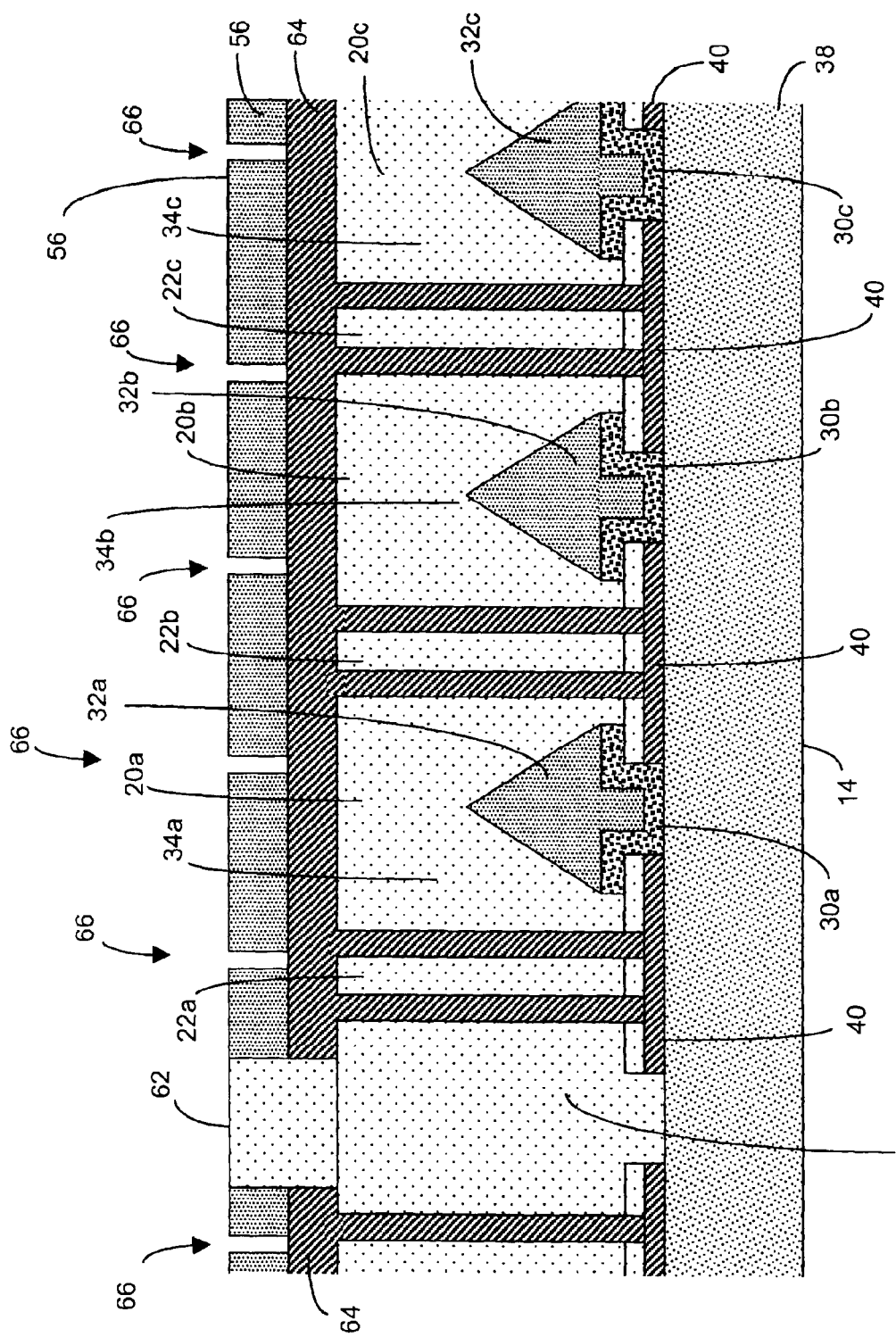
Figure 7E:
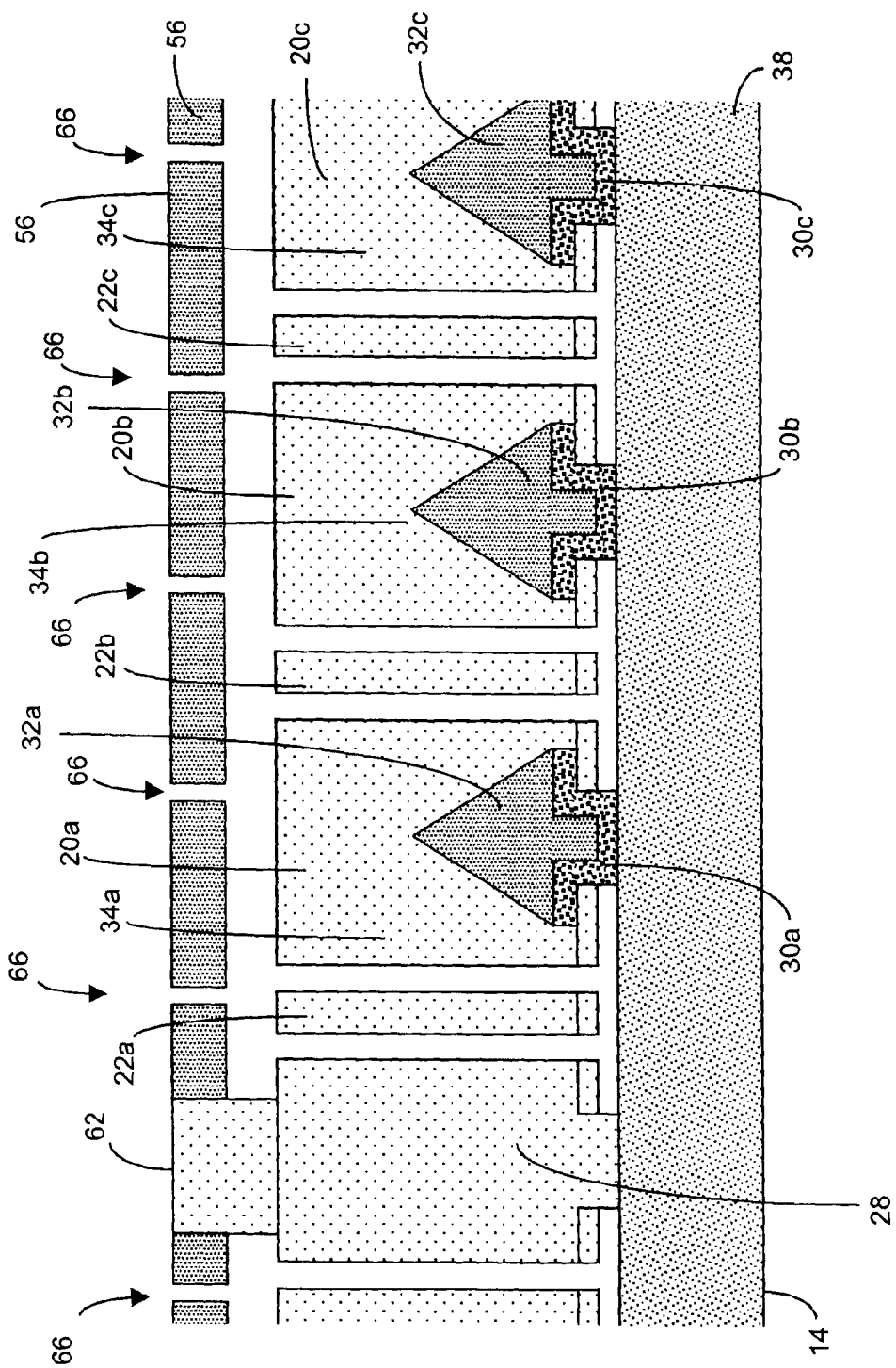

With reference to FIGS. 7D and 7E, first encapsulation layer 56 may be etched (see, FIG. 7D) to form vents 66 that are intended to permit etching and/or removal of at least selected portions of insulation layer 40 and sacrificial layer 64 (see, FIG. 7D). Again, proper design of mechanical structures 20a–c and 22a–f, insulation layer 40 and sacrificial layer 64, and control of the etch process parameters may permit the insulation layer 40 and sacrificial layer 64 to be sufficiently etched to release mechanical structures 20a–c and 22a–f and permit proper operation of MEMS 10 (see, FIG. 7E).

Figure 7F:
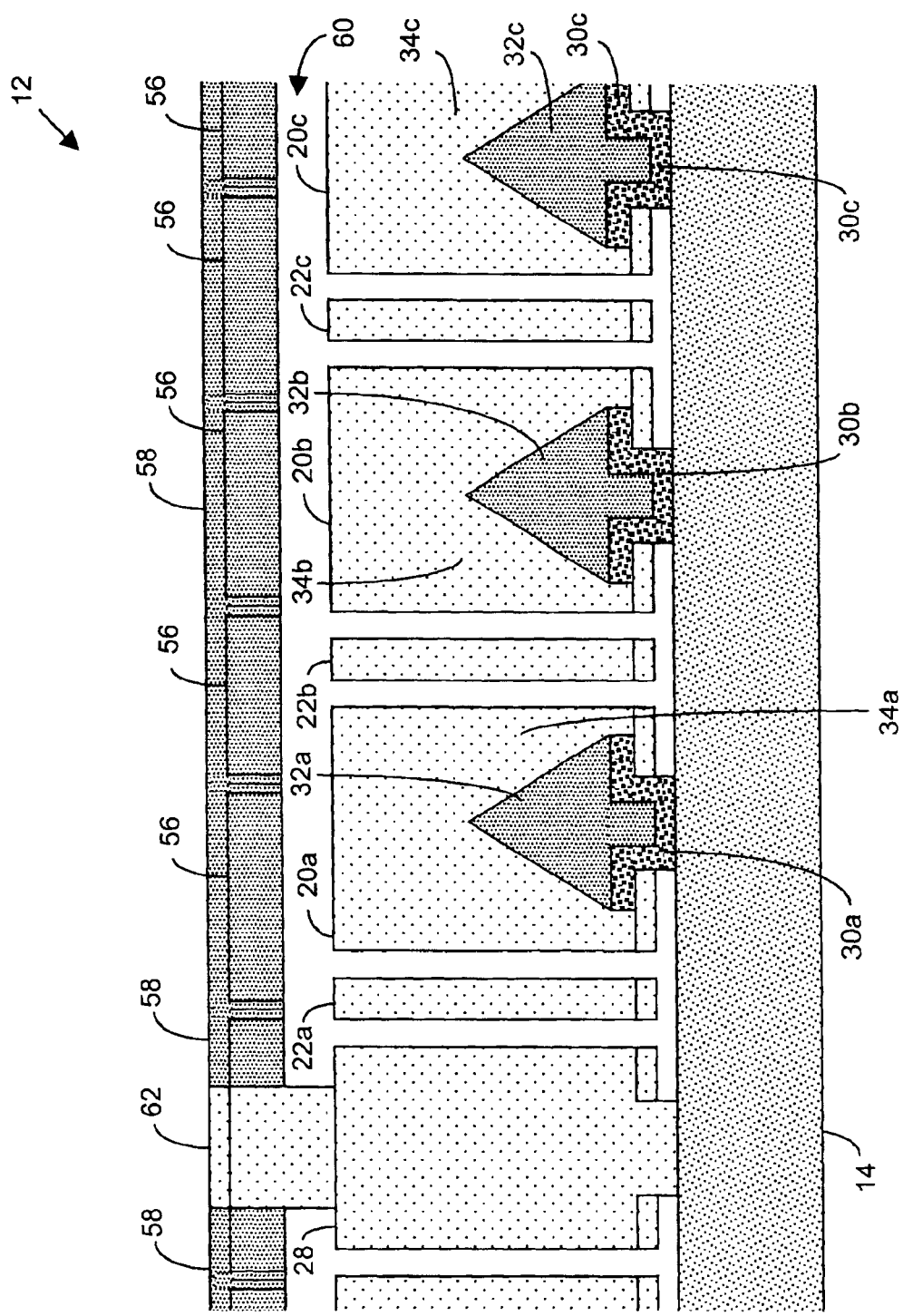

After releasing mechanical elements 20a–c and 22a–f, second encapsulation layer 58 may be deposited, formed and/or grown (see, FIG. 7F). The second encapsulation layer 58 may be, for example, a silicon-based material (for example, a monocrystalline silicon, polycrystalline silicon, silicon-germanium, and/or combinations thereof), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 56. It may be advantageous, however, to employ the same material to form first and second encapsulation layers 56 and 58 in order to enhance the "seal" of chamber 60.

As discussed in detail in Microelectromechanical Systems and Method of Encapsulating Patent Application, in certain embodiments, second encapsulation layer 58 may be doped with impurities having an opposite conductivity relative to the impurities in first encapsulation layer 56. In this way, upon completion of the sealing or encapsulation process, junctions surrounding contact via 62 are formed which electrically "isolate" contact via 62 (and contact area 28) from, for example, nearby electrically conductive regions such as field regions.

Figure 7G:
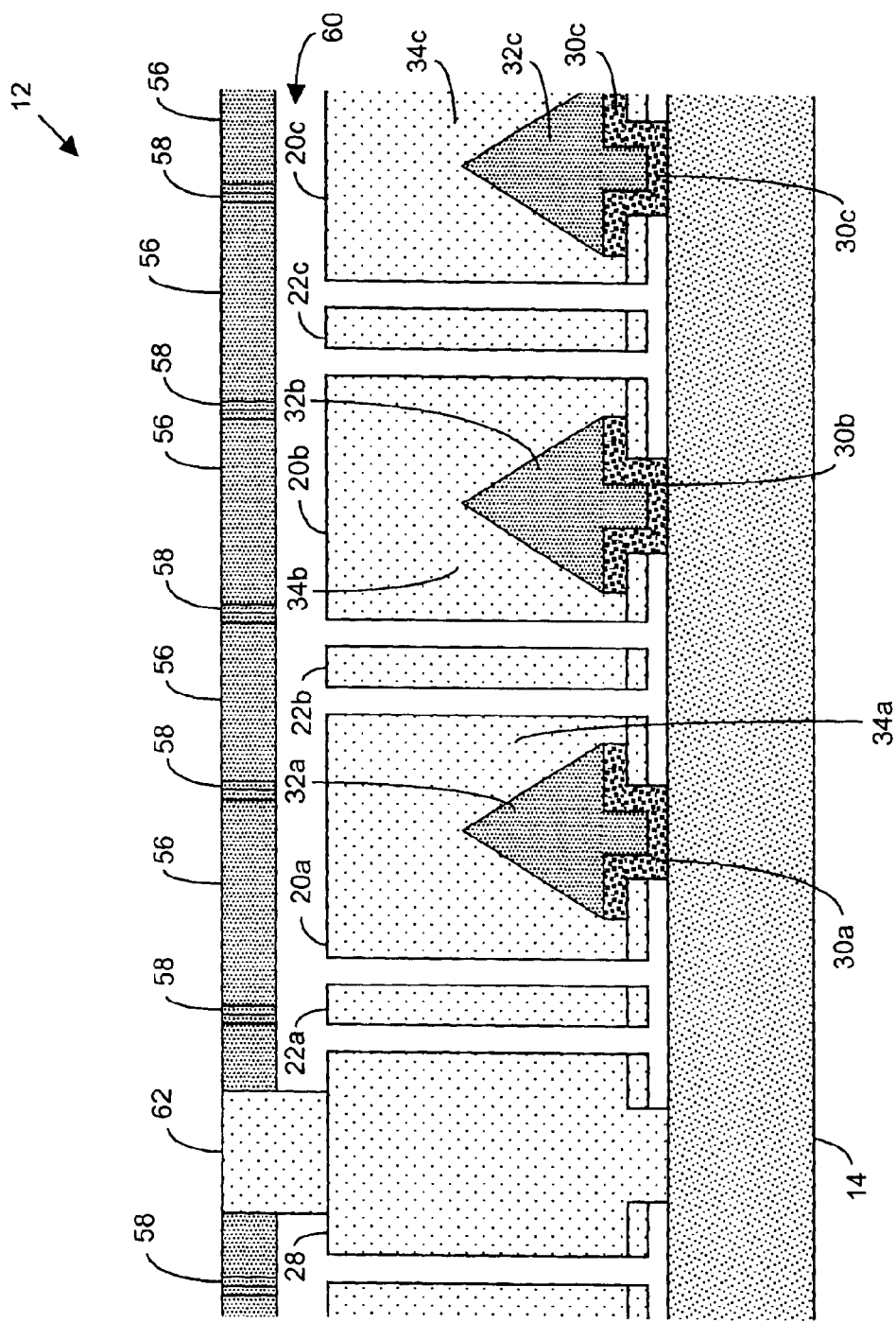

In addition, in another set of embodiments, it may be advantageous to substantially planarized the exposed surface of second encapsulation layer 58 using, for example, polishing techniques (for example, CMP). The planarization process removes a portion of second encapsulation layer 58 to provide a "smooth" surface layer and/or (substantially) planar surface. Indeed, the planarization process may remove a sufficient portion of second encapsulation layer 58 so that contact via 60 is electrically isolated by a ring of oppositely doped semiconductor layer 58 (see, FIG. 7G). This exposed planar surface may further provide a well-prepared base upon which integrated circuits (for example, CMOS transistors) and/or micromachined mechanical structure 12 may be fabricated on or in using well-known fabrication techniques and equipment.

In another set of embodiments, contact via 62 is electrically "isolated" using a trench technique. For example, the encapsulation and isolation techniques described and illustrated in non-provisional patent application entitled "Microelectromechanical Systems Having Trench Isolated Contacts, and Methods of Fabricating Same", which was filed on Jun. 4, 2003 and assigned Ser. No. 10/455,555 (hereinafter "Microelectromechanical Systems Having Trench Isolated Contacts Patent Application"), may be employed in conjunction with the anchors and anchoring techniques described and illustrated herein. For the sake of brevity, the inventions described and illustrated in the Microelectromechanical Systems Having Trench Isolated Contacts Patent Application, implemented in conjunction with the inventions described and illustrated herein, will not be repeated but will only be summarized. It is expressly noted, however, that the entire contents of the Microelectromechanical Systems Having Trench Isolated Contacts Patent Application, including for example, the features, attributes, alternatives, materials, techniques and advantages of all of the inventions, are incorporated by reference herein.

Figure 8:
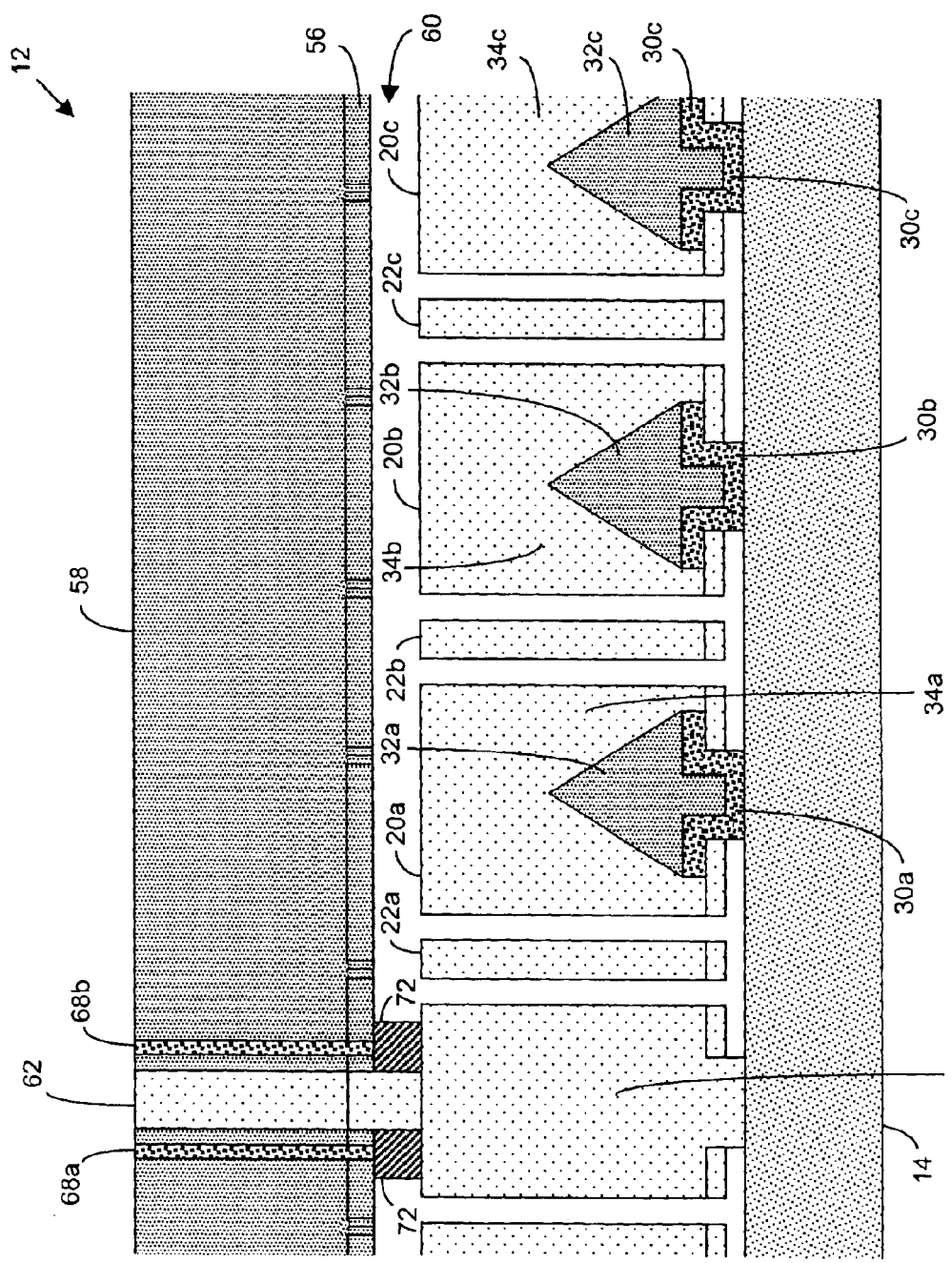
FIG. 8 illustrates a cross-sectional view (sectioned along dotted line a—a of FIG. 2) of the portion of the interdigitated or comb-like finger electrode array and contact area of FIG. 2, in accordance with certain aspects of the present invention.

Briefly, with reference to FIG. 8, micromachined mechanical structure 12 includes mechanical structures 20a–c, anchored in the manner as described above, mechanical structures 22a–f, and contact area 28. The first and second encapsulation layers 56 and 58, respectively, may seal chamber 60 using any of the techniques, materials or embodiments described in the Microelectromechanical Systems and Method of Encapsulating Patent Application and/or Microelectromechanical Systems Having Trench Isolated Contacts Patent Application. In addition, micromachined mechanical structure 12 includes dielectric isolation regions 68a and 68b that electrically isolate contact area 28 (and contact via 62) from surrounding or nearby electrically conductive regions.

Figure 9A:
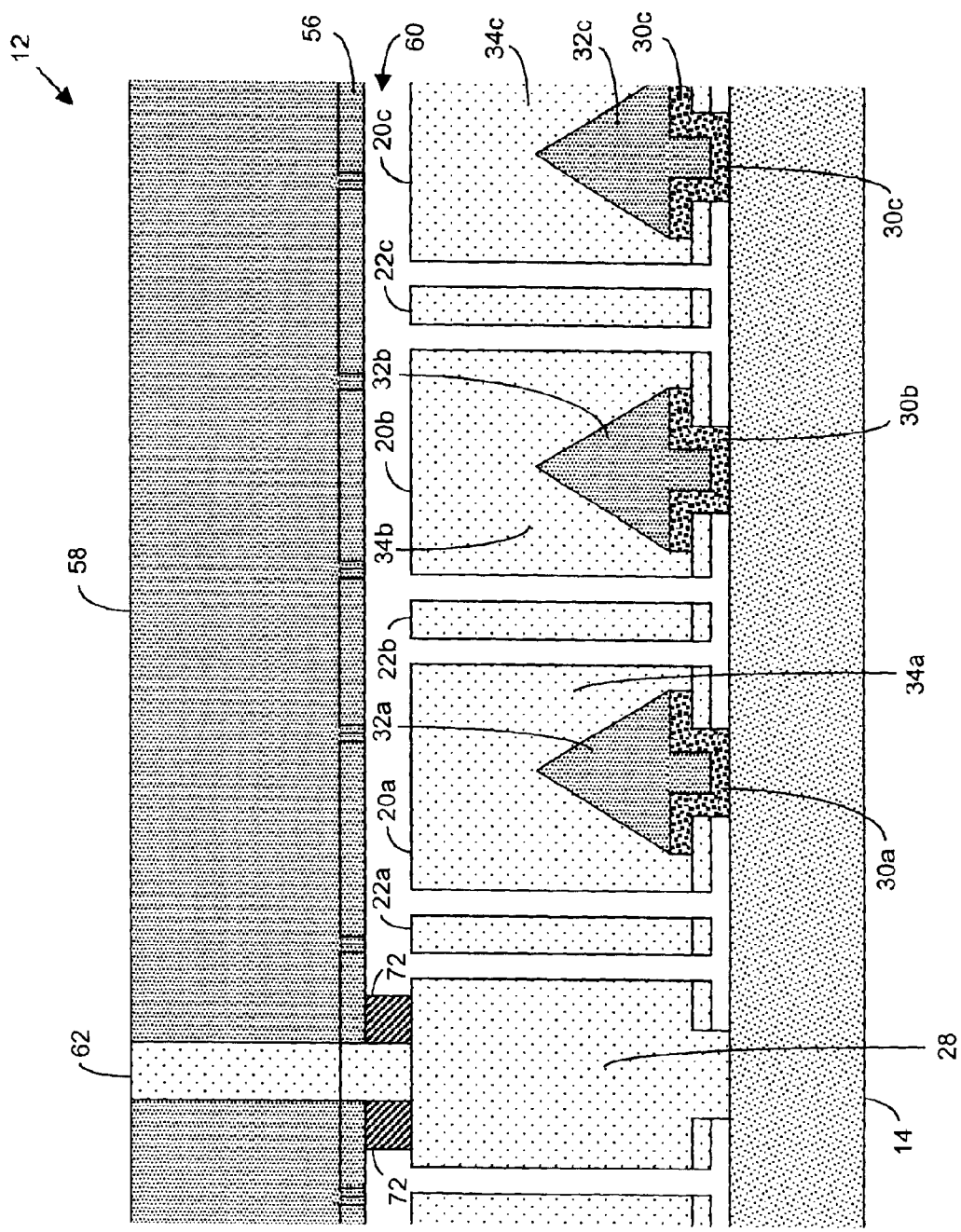
FIGS. 9A–9D illustrate cross-sectional views of the fabrication of the microstructure of FIG. 8 at various stages of the process, according to certain aspects of the present invention.
Figure 9B:
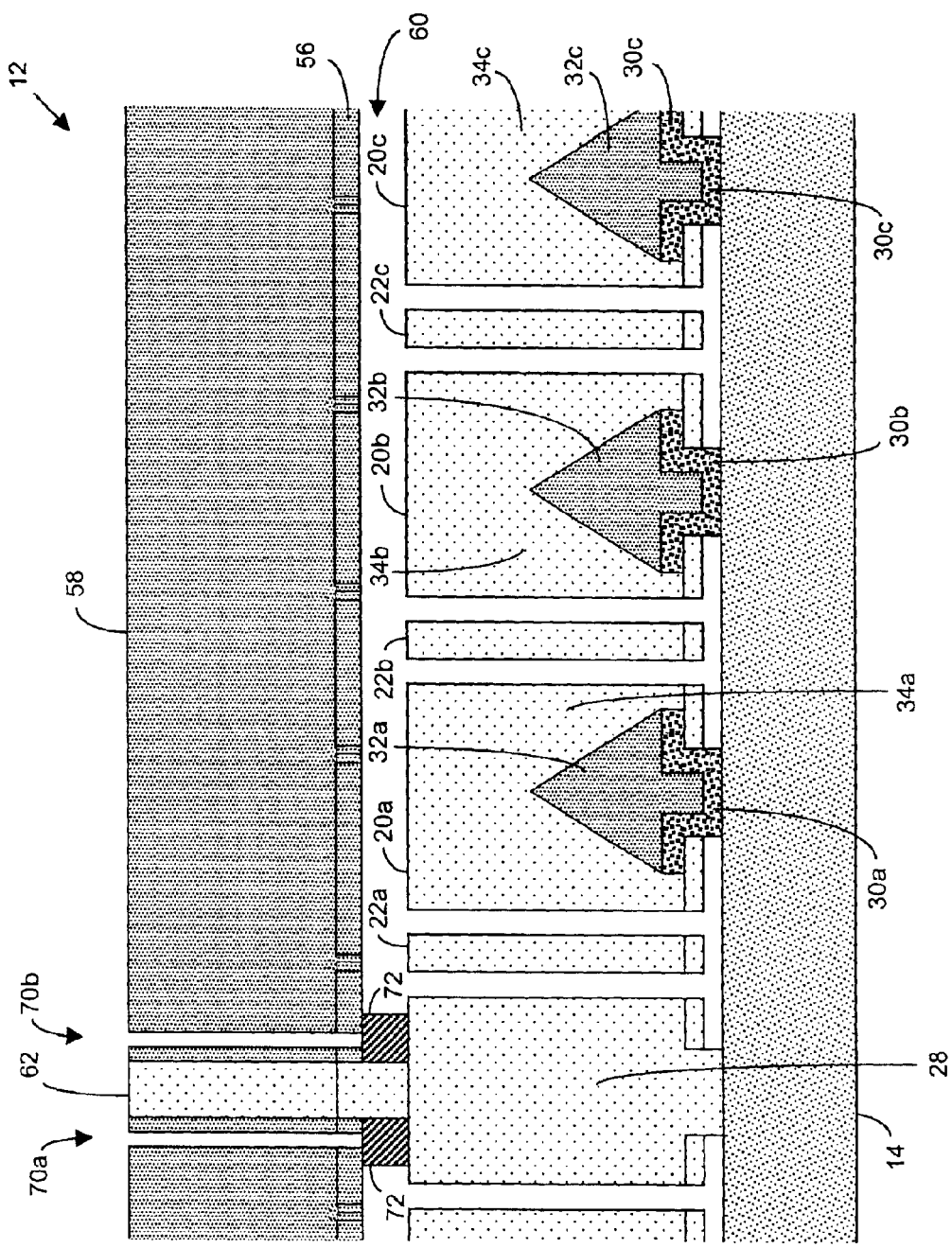
Figure 9C:
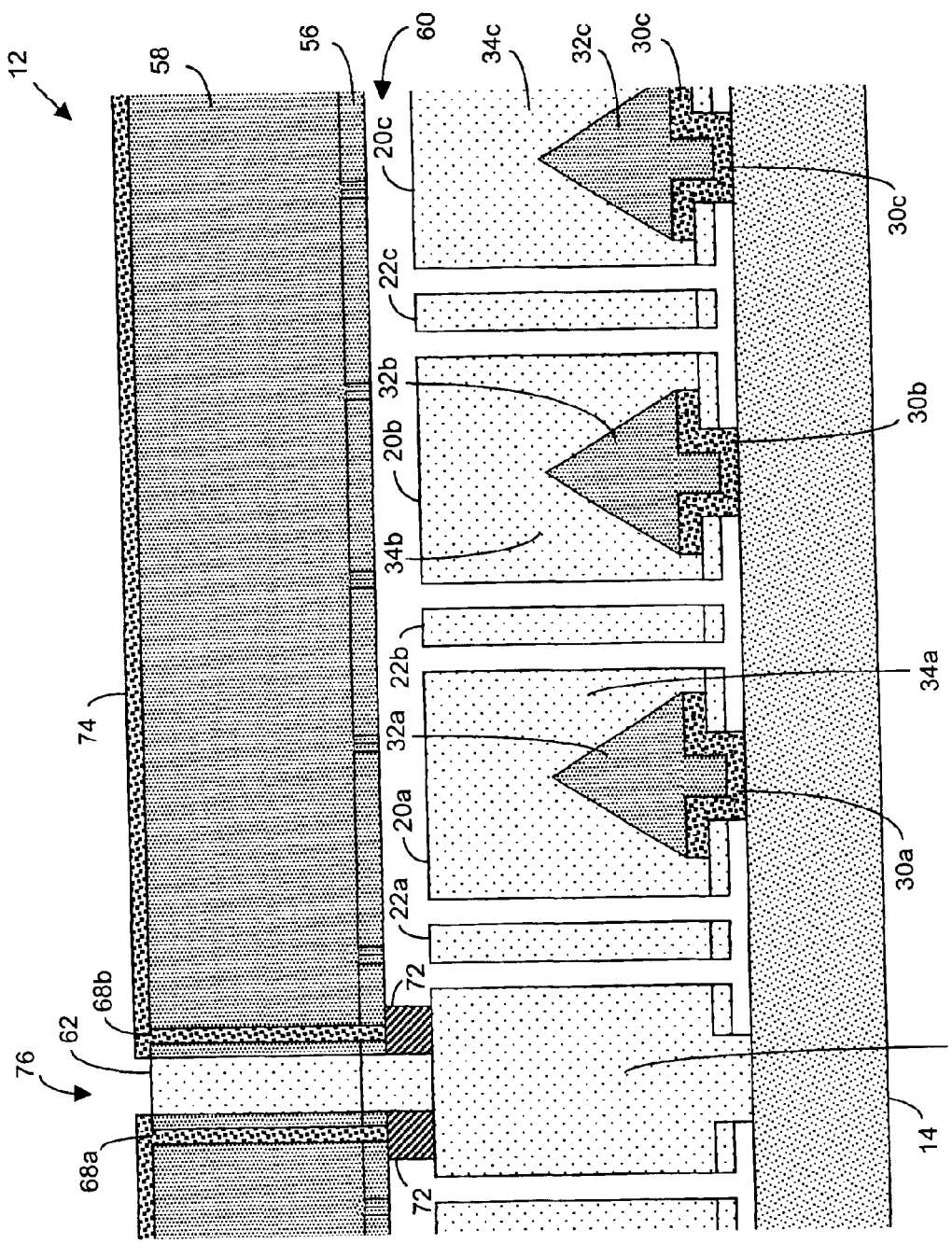

In particular, with reference to FIGS. 9A, 9B and 9C, an exemplary method of fabricating or manufacturing a micromachined mechanical structure 12 using the encapsulation and isolation techniques of Microelectromechanical Systems Having Trench Isolated Contacts Patent Application may begin with a partially formed device including mechanical structures 20a–c, anchored in the manner as described above, mechanical structures 22a–f, and contact area 28. The micromachined mechanical structure 12 has been released and sealed using, for example, techniques that are substantially similar to that described above (see, FIG. 9A). Thereafter, trenches 70a and 70b may be etched (see, FIG. 9B) and insulating material 74 may be deposited in trenches 70a and 70b to form dielectric isolation regions 68a and 68b, respectively (see, FIG. 9C).

It may be advantageous to partially etch or remove sacrificial layer 64 such that contact 28 and/or contact via 62 remain partially, substantially or entirely surrounded by portions of sacrificial layer 64. For example, with reference to FIGS. 9A and 9B, while mechanical structures 20a–c and 22a–f are released, a portion 72 of sacrificial layer 64 (i.e., juxtaposed electrical contact area 28 may remain after etching or removing sacrificial layer 64. This portion of sacrificial layer 64 may function as an etch stop during formation of trenches 70a and 70b. Under this circumstance, it may be advantageous to employ material(s) for sacrificial layer 64 that is consistent with the process to form trenches 70a and 70b such that the remaining portions of the second sacrificial layer 64 may function as an etch stop during formation of trenches 70a and 70b. This notwithstanding, sacrificial layer 64 may be, for example, silicon dioxide, silicon nitride, and doped and undoped glass-like materials, and SOG.

It should be noted that, in another embodiment, an insignificant amount of material comprising sacrificial layer 64 (or little to no sacrificial layer 64) remains after etching sacrificial layer 64. As such, materials for sacrificial layer 64 may be selected with little regard to subsequent processing.

Moreover, in this case, the etch of trenches 70a and 70b may be, for example, timed so that dielectric isolation regions 68a and 68b provide appropriate electrical isolation.

The insulating material 74 may be, for example, silicon dioxide, silicon nitride, BPSG, PSG, or SOG, or combinations thereof. It may be advantageous to employ silicon nitride because silicon nitride may be deposited more a more conformal manner than silicon oxide. Moreover, silicon nitride is compatible with CMOS processing, in the event that MEMS 10 includes CMOS integrated circuits.

Figure 10B:
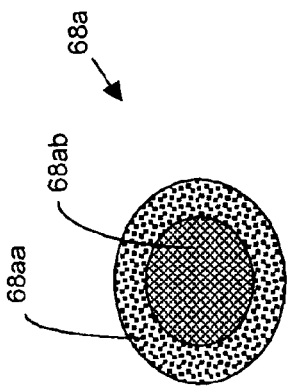
FIGS. 10A–10D illustrate cross-sectional and top views of an isolation trench according to certain aspects of the present invention.
Figure 10D:
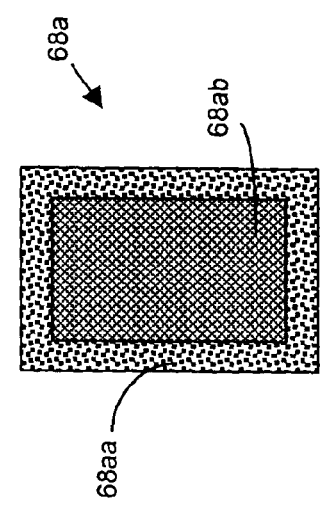
Figure 10A:
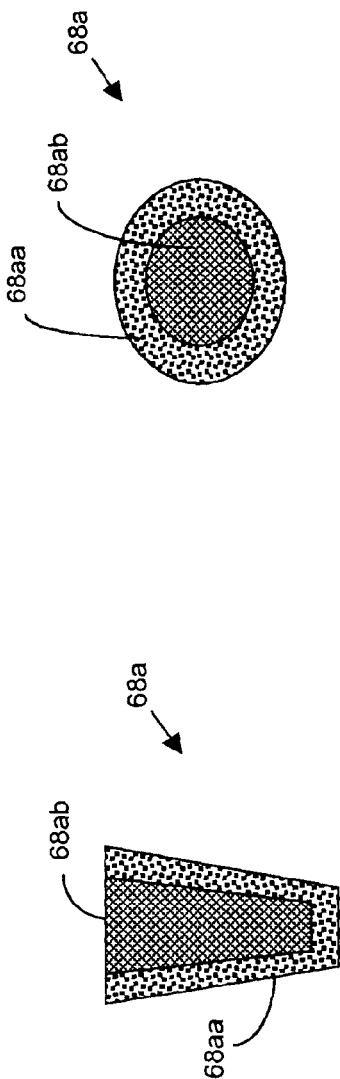
Figure 10C:
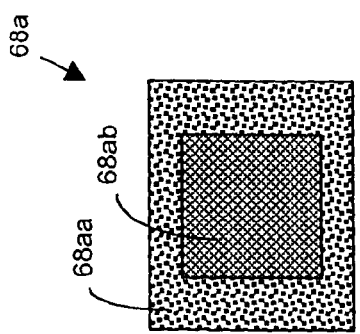
Figure 11A:
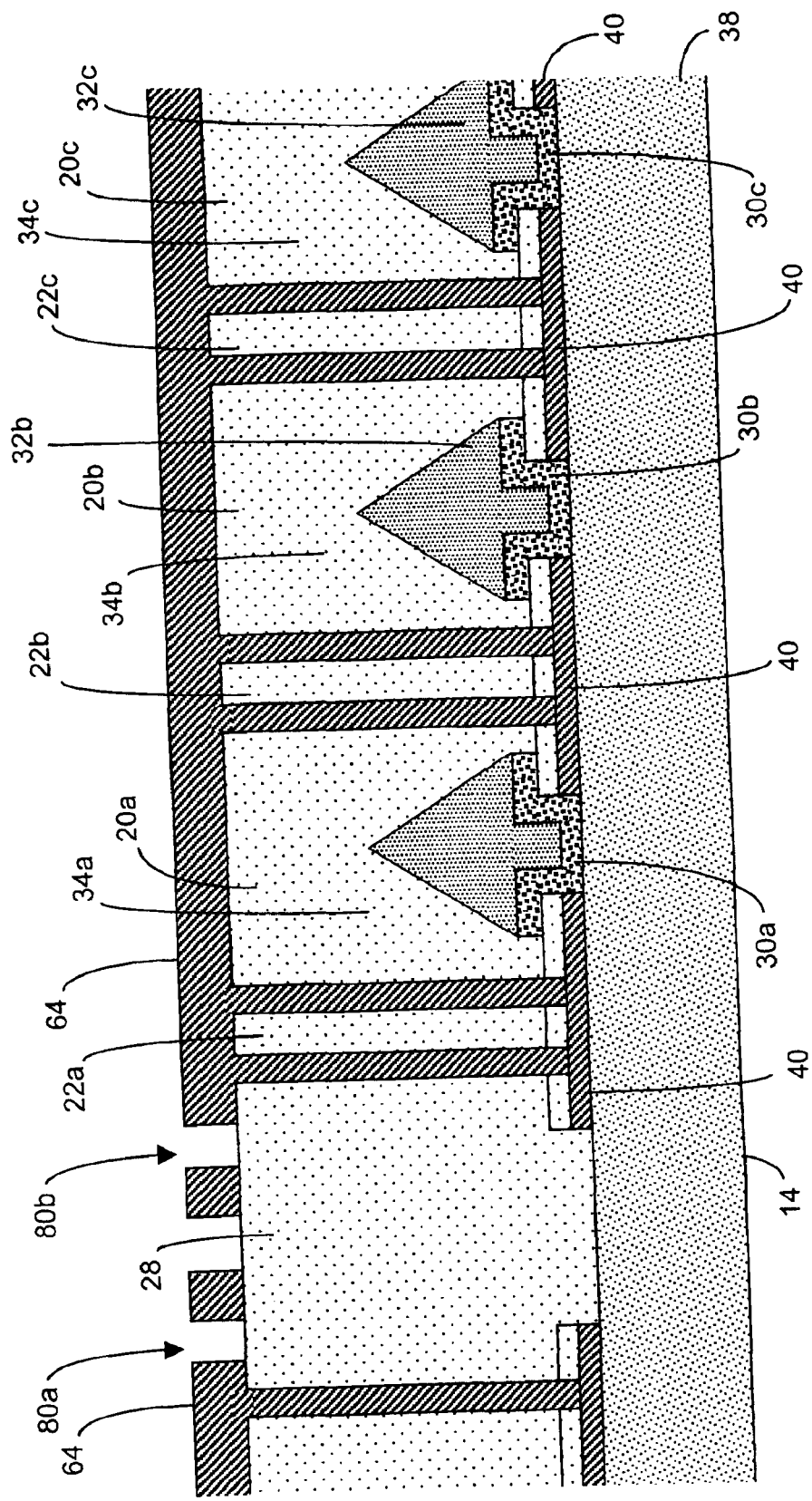
FIGS. 11A–11F illustrate cross-sectional views of the fabrication of a microstructure, having a trench isolated contact, at various stages of the process, according to certain aspects of the present invention.
Figure 11B:
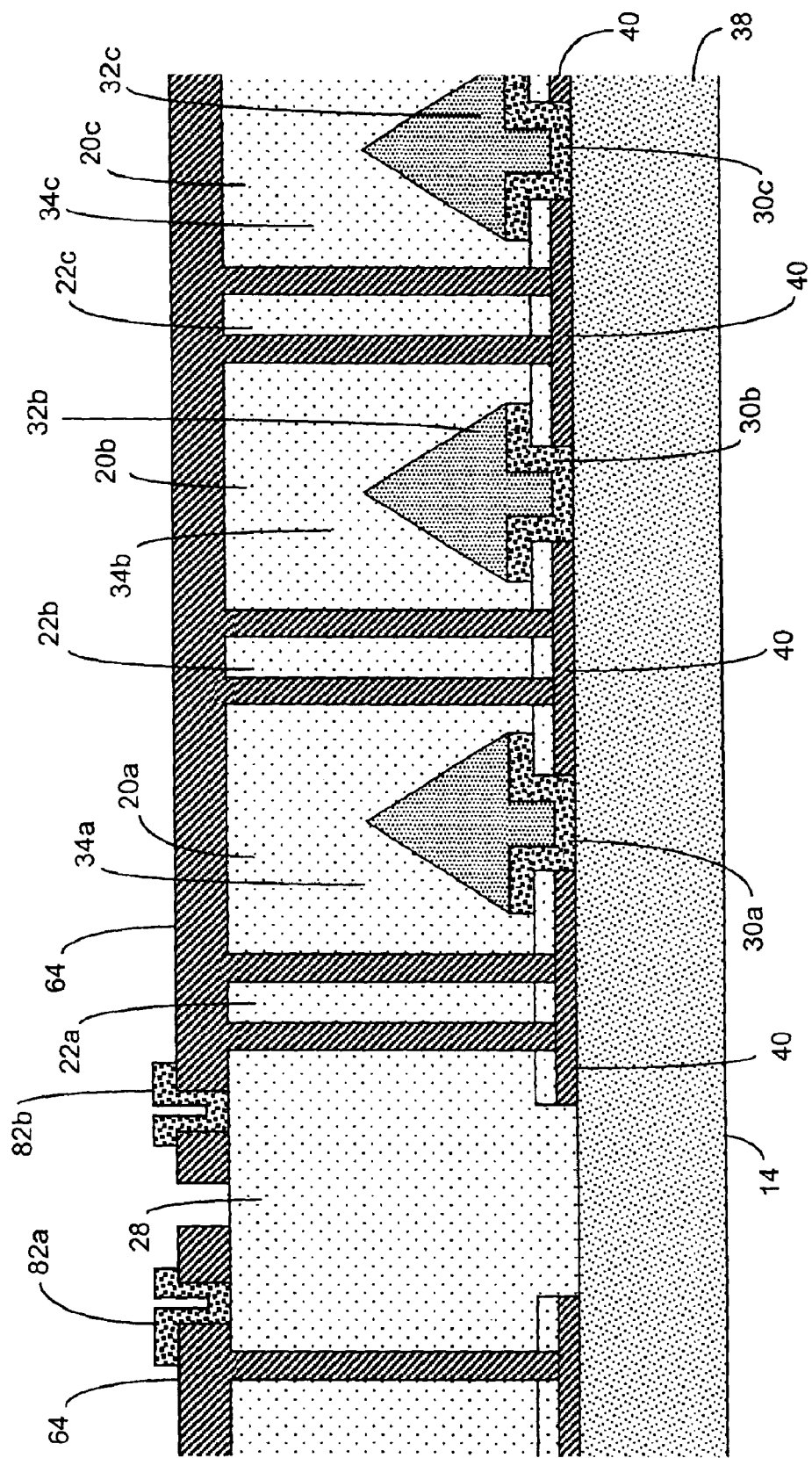
Figure 11C:
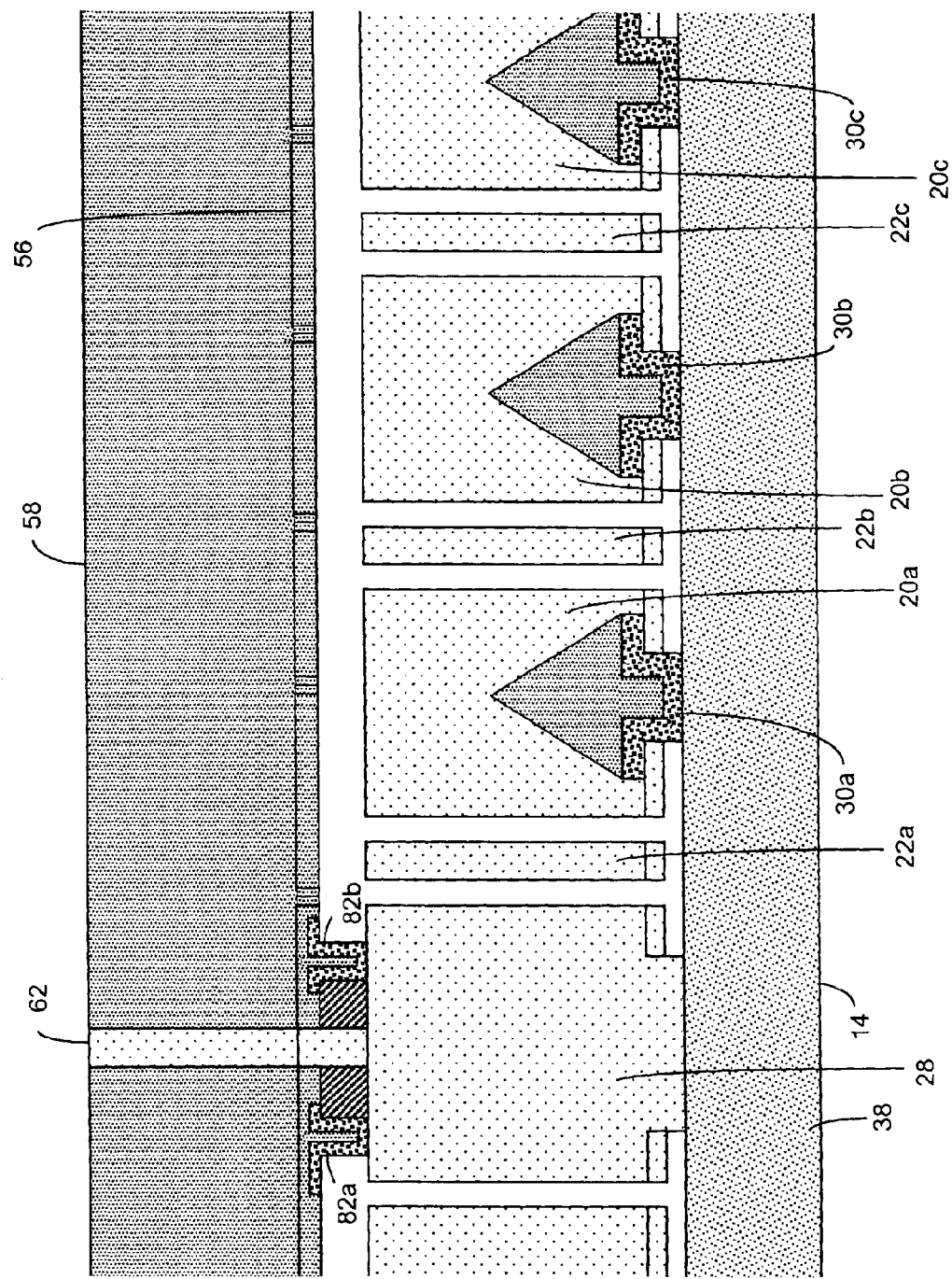
Figure 11D:
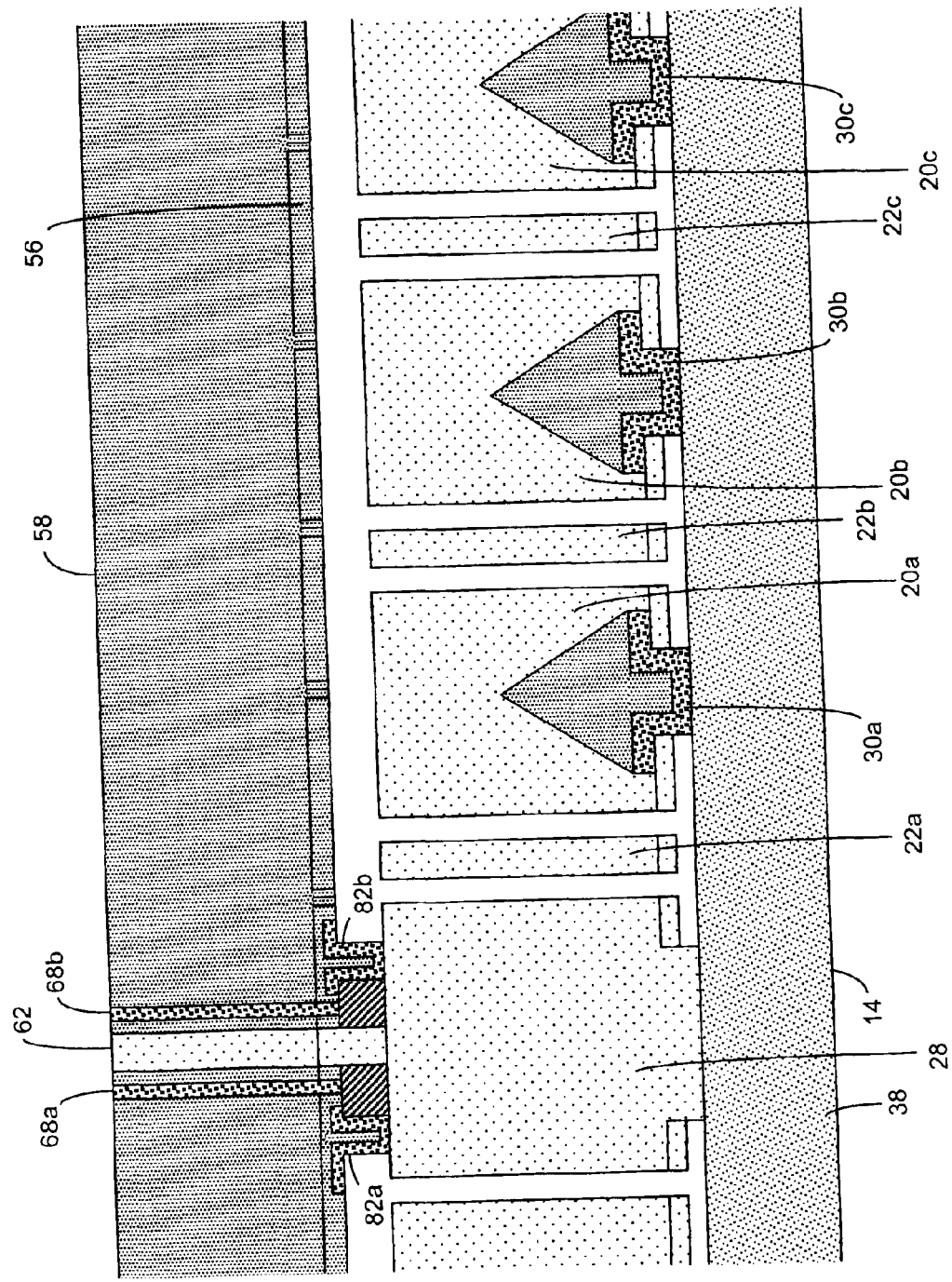
Figure 11E:
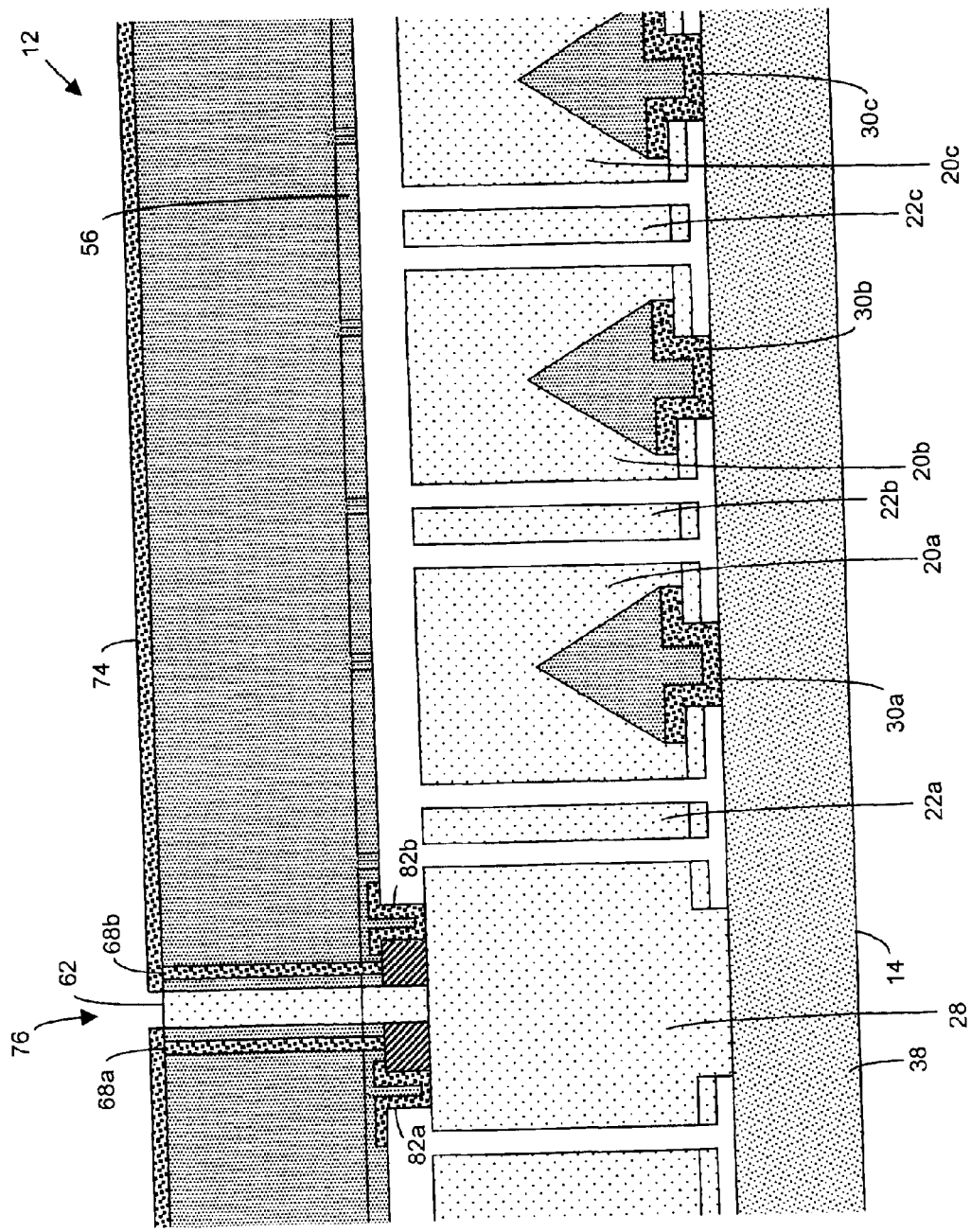
Figure 11F:
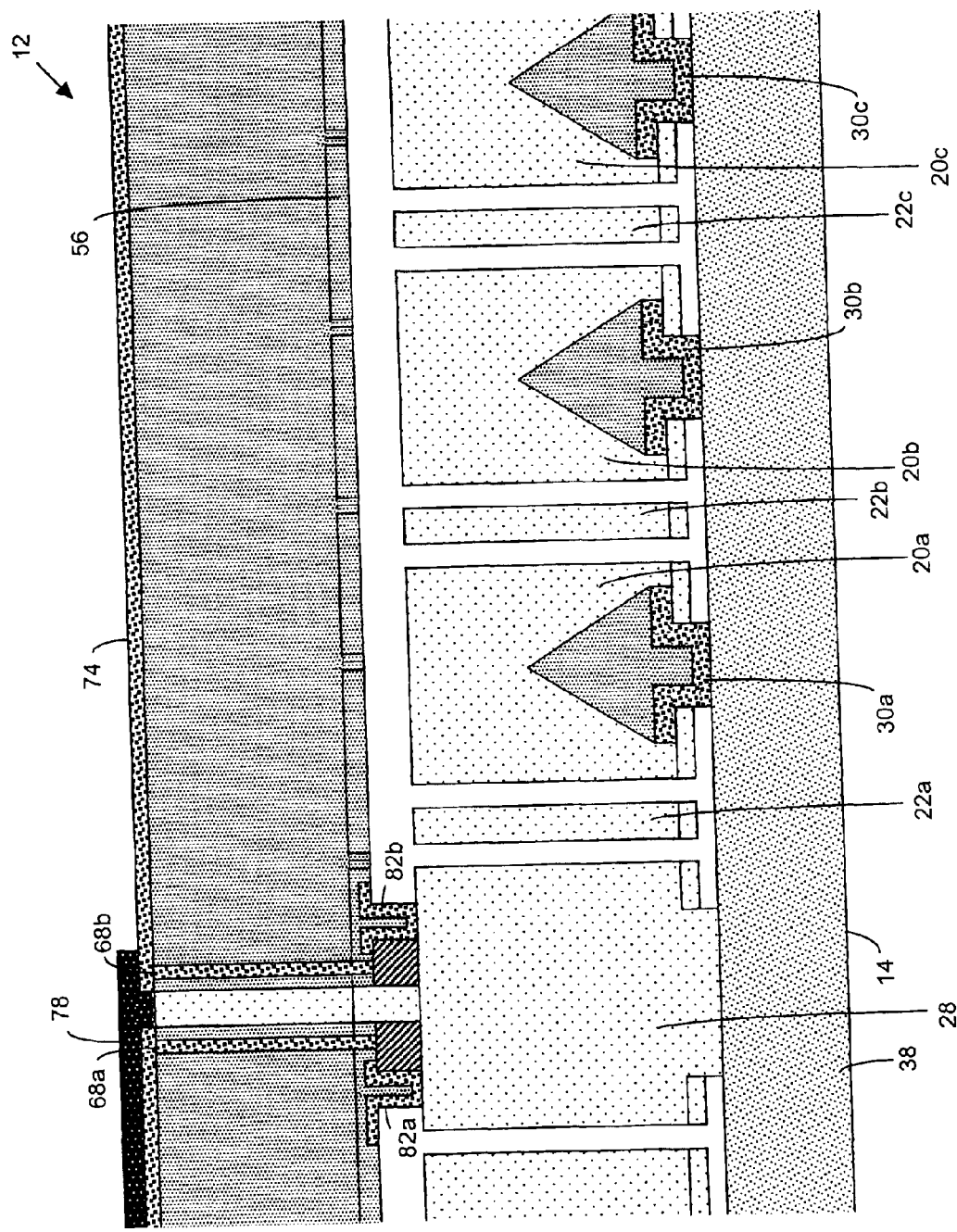

With reference to FIGS. 10A–D, dielectric isolation regions 68a and 68b may also include a slight taper in order to facilitate the formation of isolation regions 68a and 68b (see, FIG. 10A). In addition, dielectric isolation regions 68a and 68b may include a plurality of materials, including, for example, a first material 68aa (for example, silicon dioxide, silicon nitride, BPSG, PSG, or SOG) and a second material 68ab (for example, a silicon based material such as polycrystalline silicon). In this way, an electrical isolation is provided by way of insulating material 68aa while a limited amount of dielectric is exposed to the surface of micromachined mechanical structure 12 (see, FIGS. 10A–D).

Notably, after formation of dielectric isolation regions 68a and 68b, it may be advantageous to substantially planarize micromachined mechanical structure 12 to provide a "smooth" surface layer and/or (substantially) planar surface. In this way, the exposed planar surface of micromachined mechanical structure 12 may be well-prepared base upon which integrated circuits (for example, CMOS transistors) and/or micromachined mechanical structure 12 may be fabricated on or in using well-known fabrication techniques and equipment.

In another embodiment, portions 72a and 72b of sacrificial layer 64 are defined prior to releasing mechanical structures 20a–c and 22a–f by way of etching or removing sacrificial layer 64. With reference to FIGS. 11A–D, additional openings 80a and 80b are formed or patterned in sacrificial layer 64 (see, FIG. 11A) to provide regions to deposit and form etch stop portions 82a and 82b (see, FIG. 11 B). The etch stop portions 82a and 82b may be the same material as anchors 30a–c. In this way, portions 72a and 72b of sacrificial layer 64 remain relatively intact during the processes that release of mechanical structures 20a–c and 22a–f. After mechanical structures 20a–c and 22a–f have been released and first and second encapsulation layers 56 and 58 have been deposited, formed and/or grown (see, FIG. 11C), trenches 70a and 70b are formed or etched and thereafter filled, as described above, to provide dielectric isolation regions 68a and 68b (see, FIG. 11D).

Notably, the techniques of fabricating dielectric isolation regions 68a and 68b, as illustrated in FIGS. 11A–D (and FIGS. 11E and 11F), may be implemented in MEMS 10 that does not include anchors 30a–c. Indeed, the embodiment of FIGS. 11A–D (and FIGS. 11E and 11F) may be implemented using any anchoring technique or structure including any of the embodiments described and illustrated in Microelectromechanical Systems Having Trench Isolated Contacts Patent Application. For the sake of brevity, those embodiments, and combinations thereof, will not be repeated but are incorporated by reference herein.

Figure 9D:
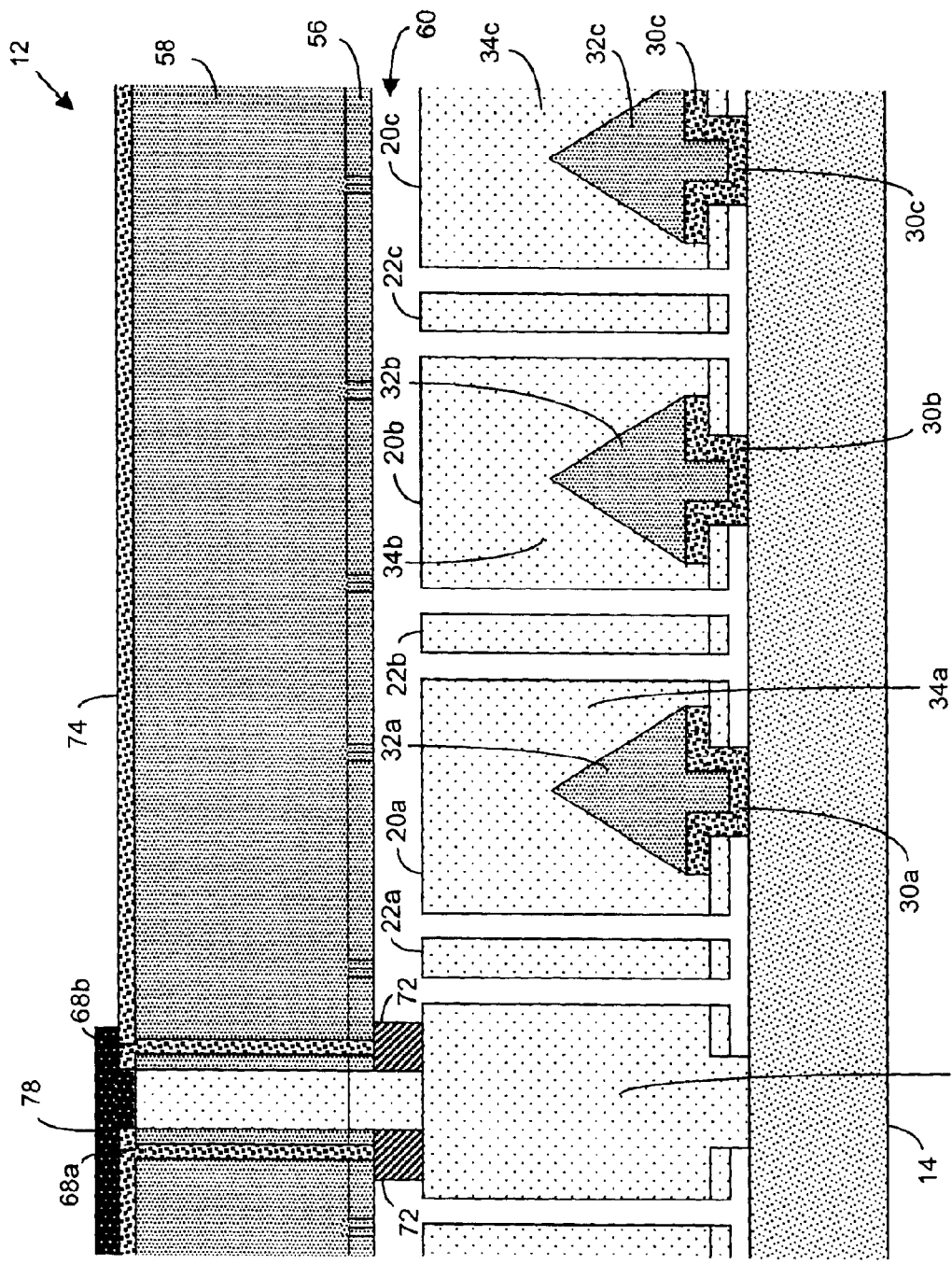

In another embodiment, dielectric isolation regions 68a and 68b may be formed or completed while processing the "back-end" of the integrated circuit fabrication of MEMS 10. In this regard, with reference to FIGS. 9C, 9D, 11E and 11F, during deposition, formation and/or growth of insulation layer 74, trenches 70a and 70b may also be etched and filled to form dielectric isolation regions 68a and 68b. Thereafter, contact opening 76 may be etched to facilitate electrical connection to contact area 28, via contact plug 62 (see, FIG. 9C and FIG. 11E). A conductive layer 78 may then be deposited to provide the appropriate electrical connection to contact 28 (see, FIG. 9D and FIG. 11F).

Notably, in the embodiments of FIGS. 9C and 9D, and 11E and 11F, the processing pertaining to the dielectric isolation regions 68a and 68b may be "combined" with the insulating and contact formation step of the "back-end" of the integrated circuit fabrication of MEMS 10. In this way, fabrication costs may be reduced.

Figure 12A:
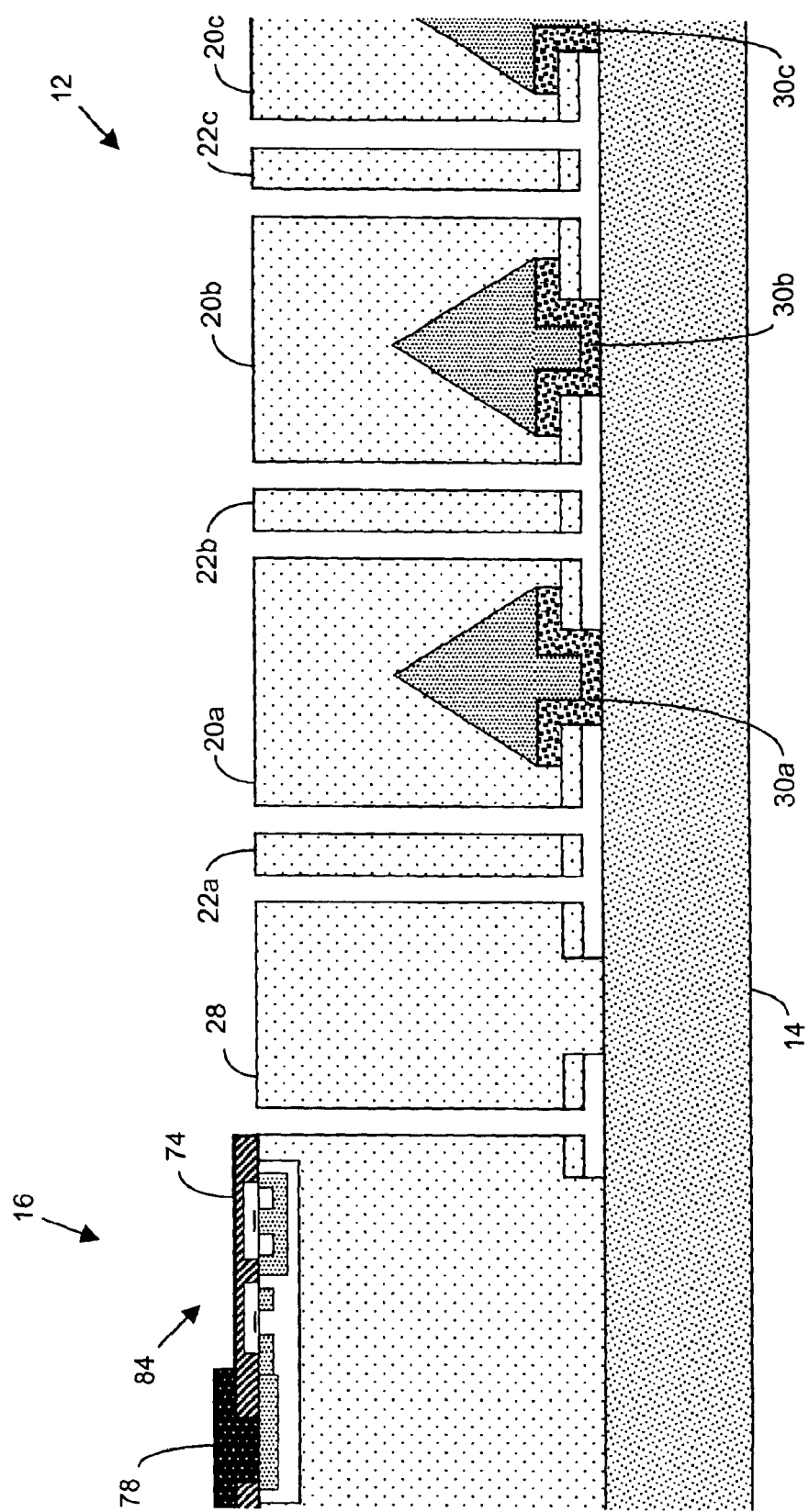
FIGS. 12A–12E, 13A and 13B illustrate cross-sectional views of MEMS according to certain aspects of the present inventions, including a micromachined mechanical structure portion and an integrated circuit portion, both portions of which are disposed or integrated on or in a common substrate.
Figure 12B:
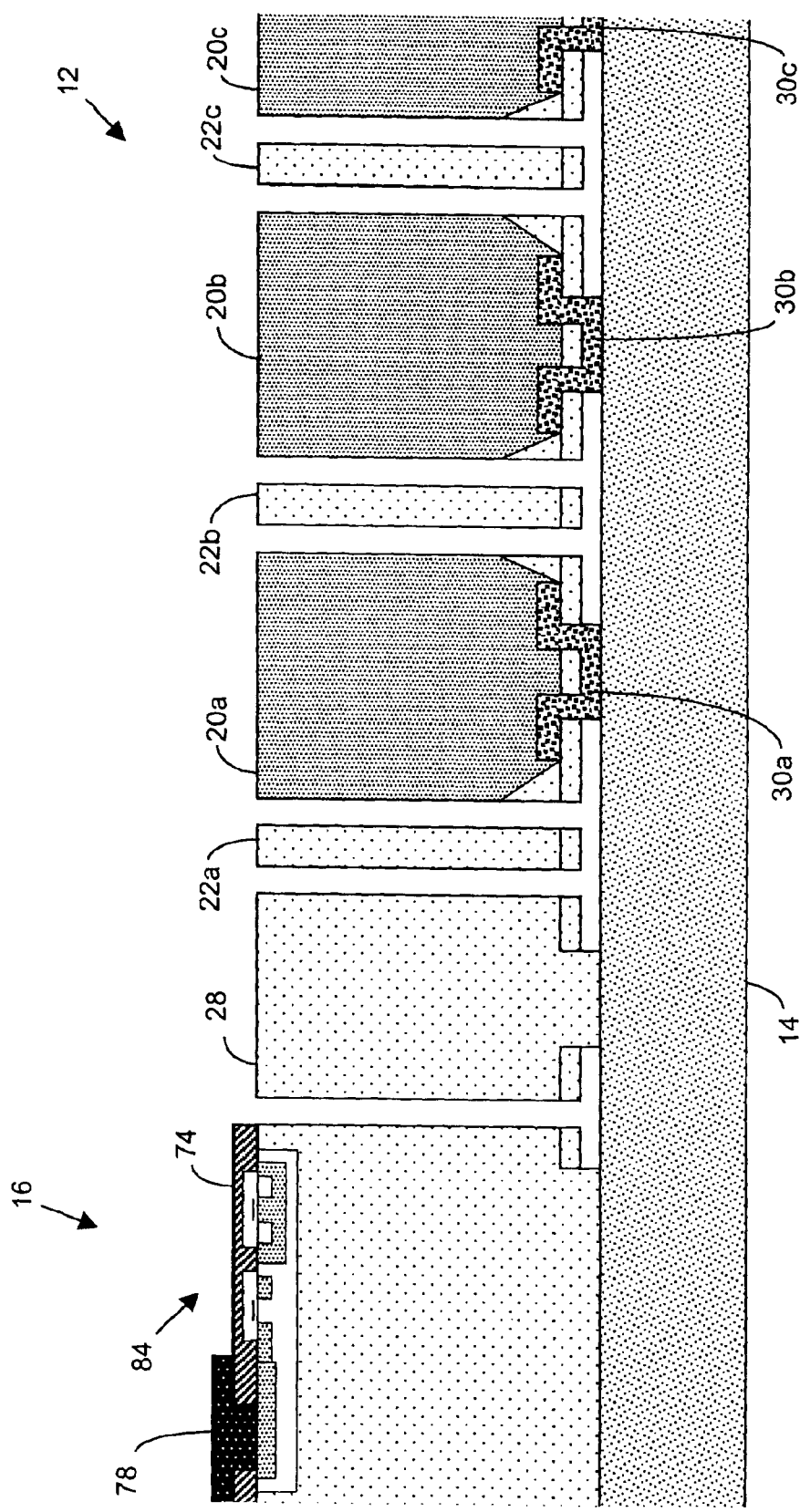
Figure 12C:
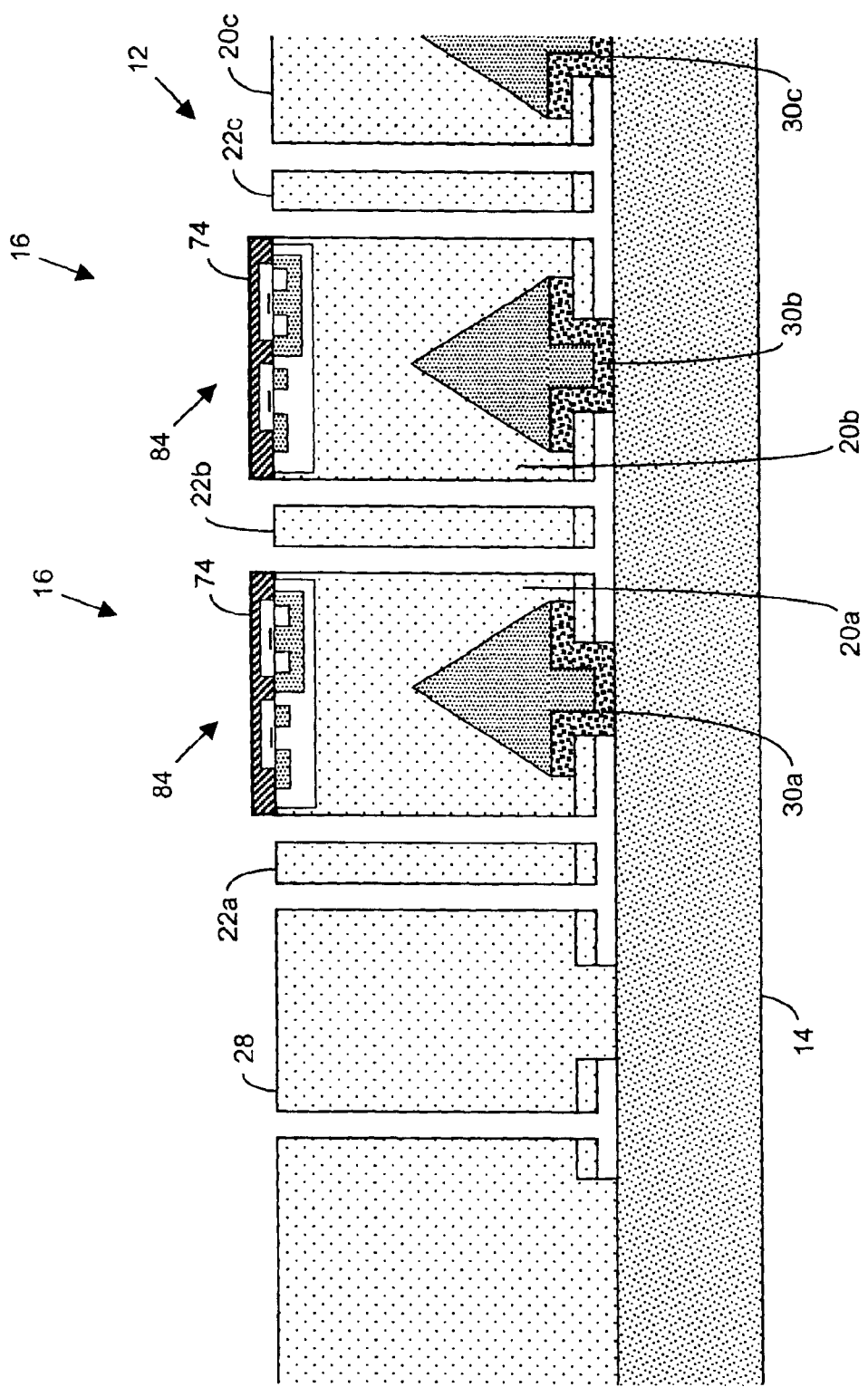
Figure 12D:
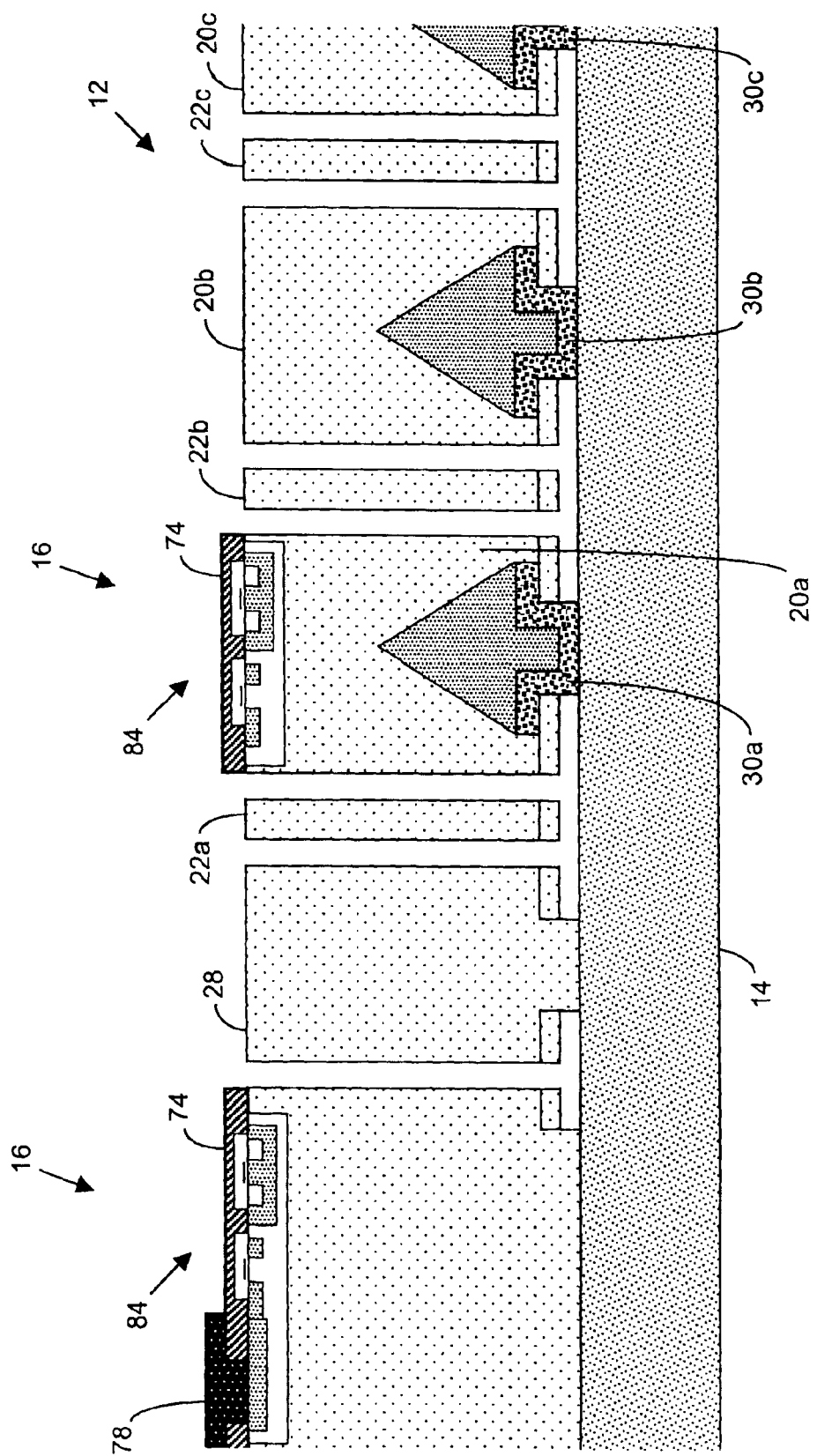
Figure 12E:
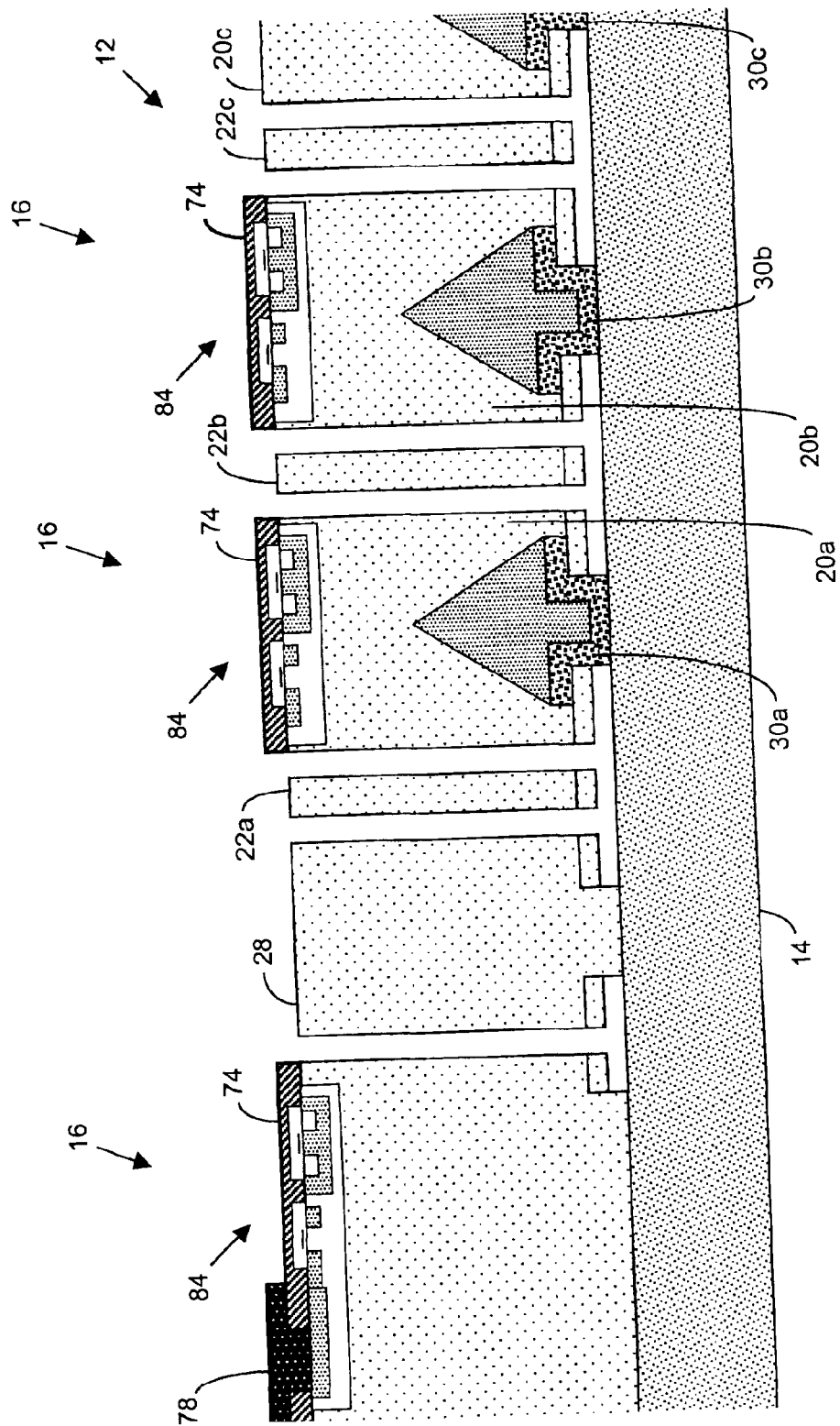

Thus, in one set of embodiments, a monolithic structure may include mechanical structure 12 and data processing electronics 16 and/or interface circuitry 18 that are integrated on or in a common substrate. With reference to FIGS. 12A–12E, MEMS 10 includes micromachined mechanical structure 12, having structures 20a–20c and 22a–c and contact area 28, as well as data processing electronics 16, including integrated circuits 84 disposed in a field region or other semiconductor region having a single crystalline structure. The integrated circuits 54 may be fabricated using conventional techniques before trenches 50a–g are formed (see, for example, FIG. 4E). As mentioned above, mechanical structures 20a–20c and 22a–c (and contact 24) may be formed primarily from, for example, a single crystalline material (FIGS. 12A, 12C, 12D and 12E) or a polycrystalline material (FIG. 12B).

Figure 13A:
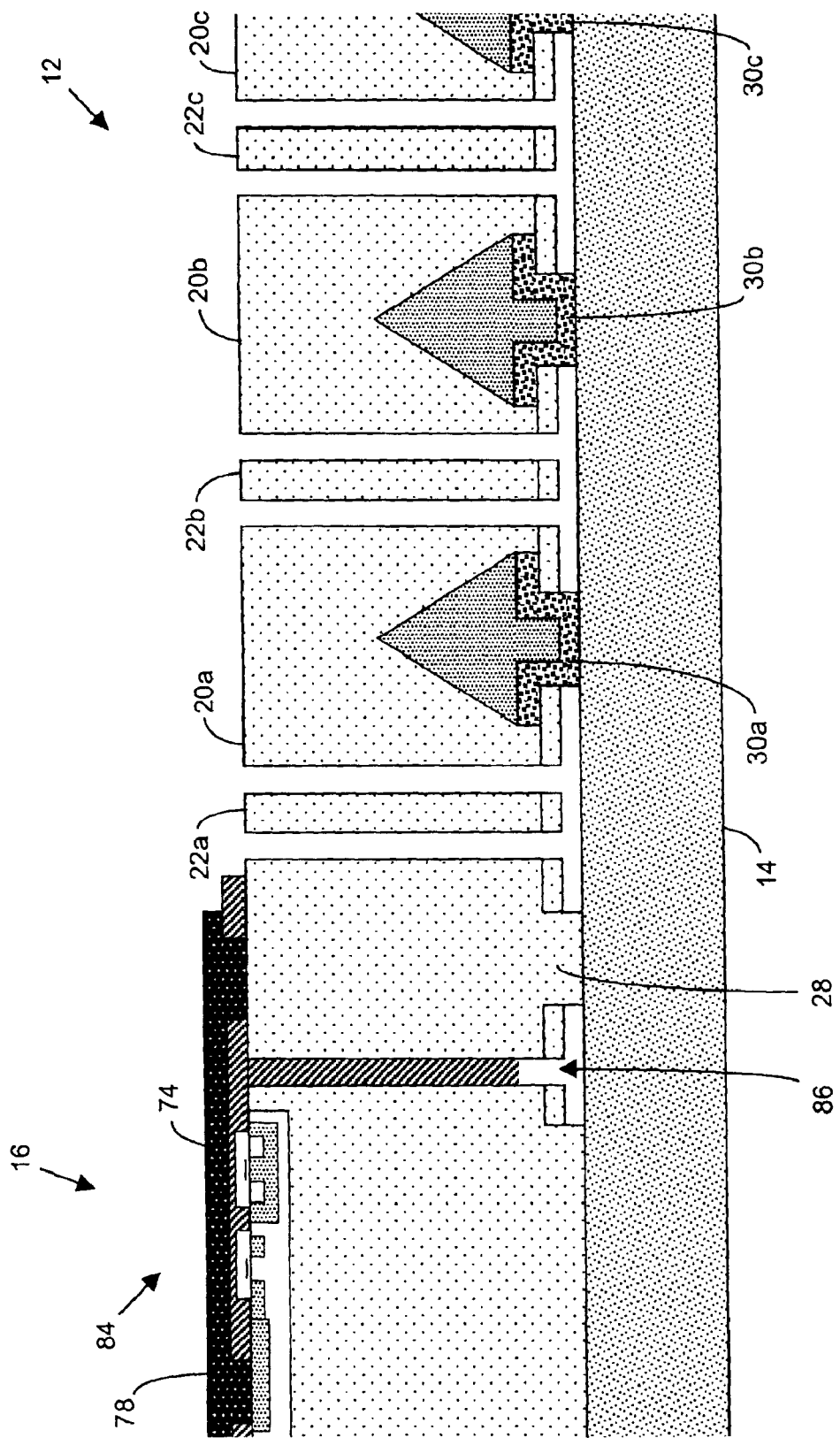

With reference to FIG. 13A, contact 28 may be accessed directly by integrated circuitry 84 via conductive layer 78. In particular, in one embodiment, an insulation material may be deposited in trench 86 between the field region on which integrated circuitry 84 is formed and contact 28. Thereafter, a low resistance electrical path, for example, conductive layer 78, may be deposited and patterned to facilitate connection.

Figure 13B:
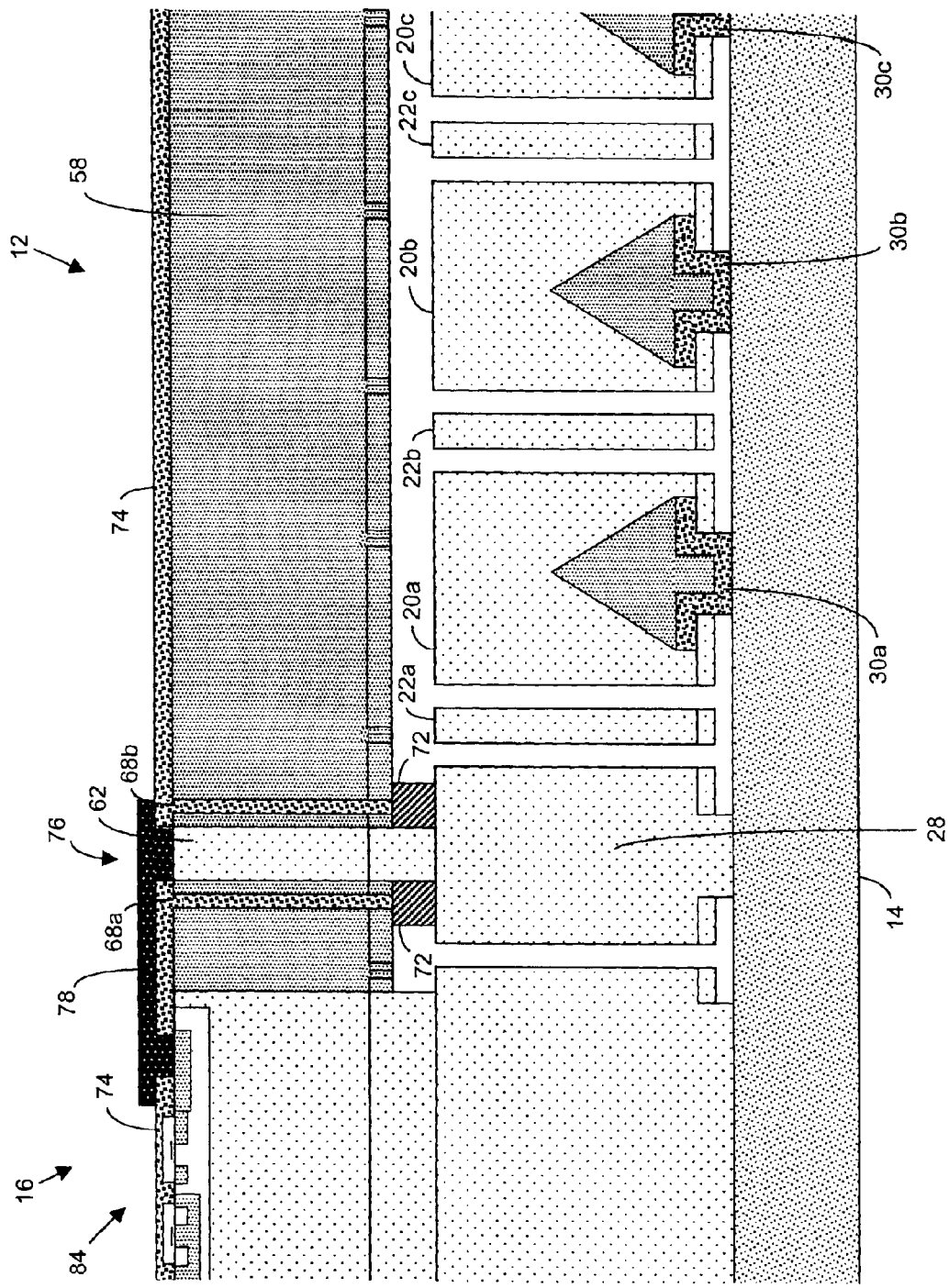
Figure 14A:
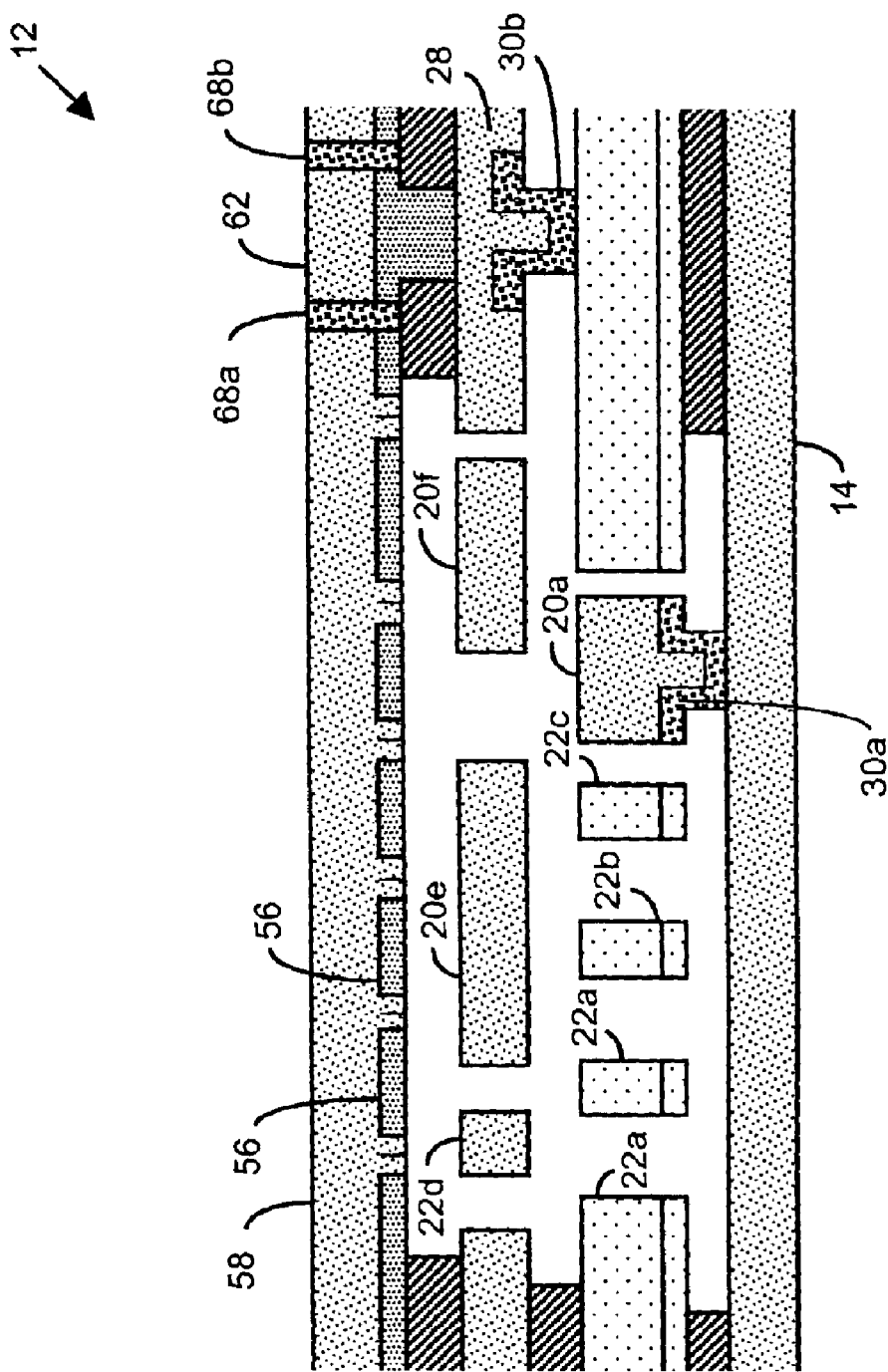
FIGS. 14A and 14B illustrate cross-sectional views of the fabrication of a micromechanical structure, having a plurality of microstructures and a contact, which are monolithically integrated on or within the substrate of a MEMS, in accordance with certain aspect of the present invention.
Figure 14B:
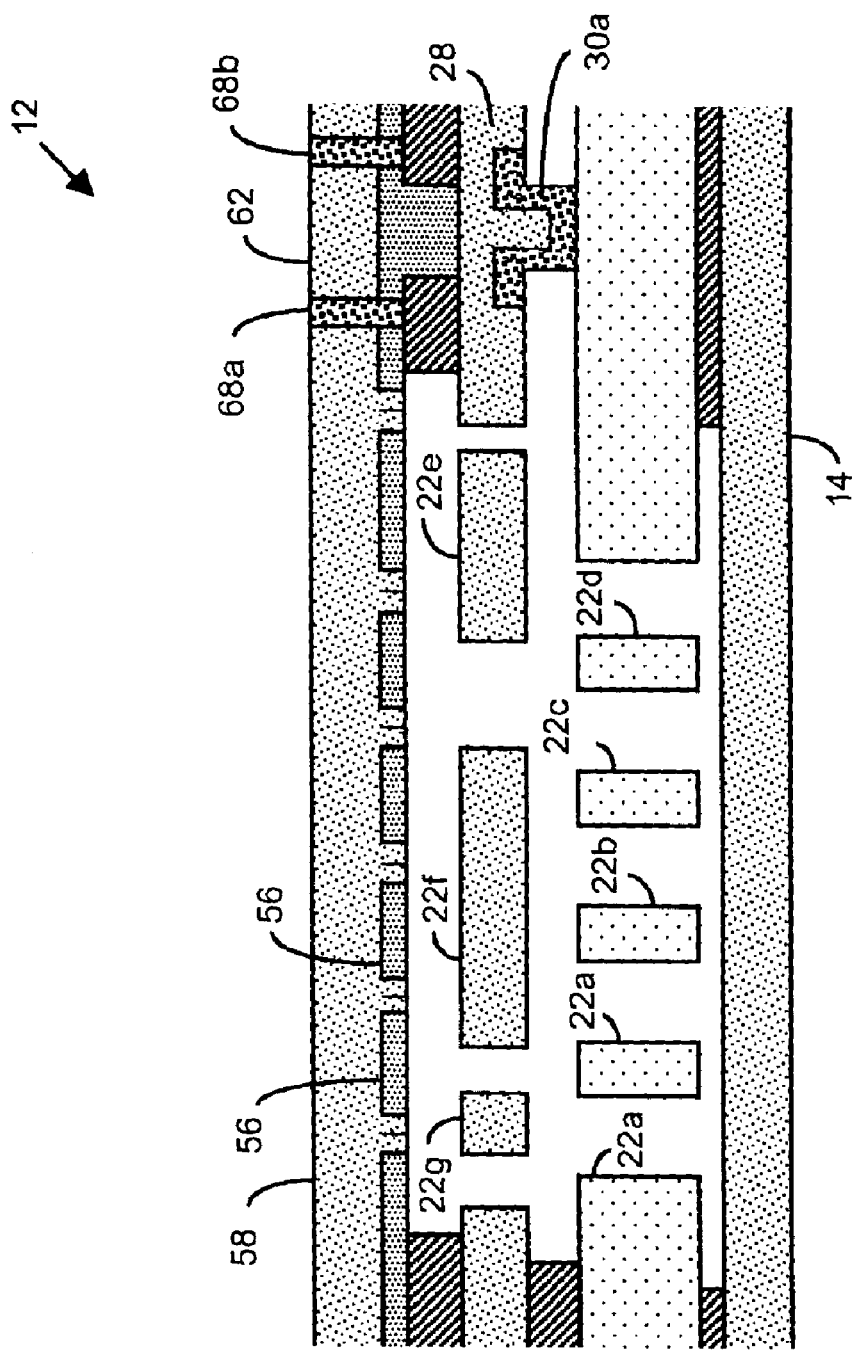

It should be noted that integrated circuits 54 may be fabricated using conventional techniques after definition of mechanical structure 12 using, for example, the techniques described and illustrated in Microelectromechanical Systems and Method of Encapsulating Patent Application and/or Microelectromechanical Systems Having Trench Isolated Contacts Patent Application (see, for example, FIG. 13B). In this regard, after fabrication and encapsulation of mechanical structure 12, having anchors 30a–c, integrated circuits 84 may be fabricated using conventional techniques and interconnected to contact area 28 by way of conductive layer 78. In particular, as illustrated and described in Microelectromechanical Systems and Method of Encapsulating Patent Application (for example, FIGS. 12A–C thereof and/or Microelectromechanical Systems Having Trench Isolated Contacts Patent Application (for example, FIGS. 14A–E thereof), the contact area is accessed directly by integrated circuitry 84 via a low resistance electrical path (i.e., conductive layer 78) that facilitates a good electrical connection. The insulation layer 74 may be deposited, formed and/or grown and patterned and, thereafter, conductive layer 78 (for example, a heavily doped polysilicon or metal such as aluminum, chromium, gold, silver, molybdenum, platinum, palladium, tungsten, titanium, and/or copper) is formed. Notably, as mentioned above, all of the embodiments described and illustrated in Microelectromechanical Systems and Method of Encapsulating Patent Application and/or Microelectromechanical Systems Having Trench Isolated Contacts Patent Application may be fabricated using the substrate anchoring techniques described and illustrated in this application. For the sake of brevity, those combinations will not be repeated but are incorporated by reference herein.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

Figure 5:
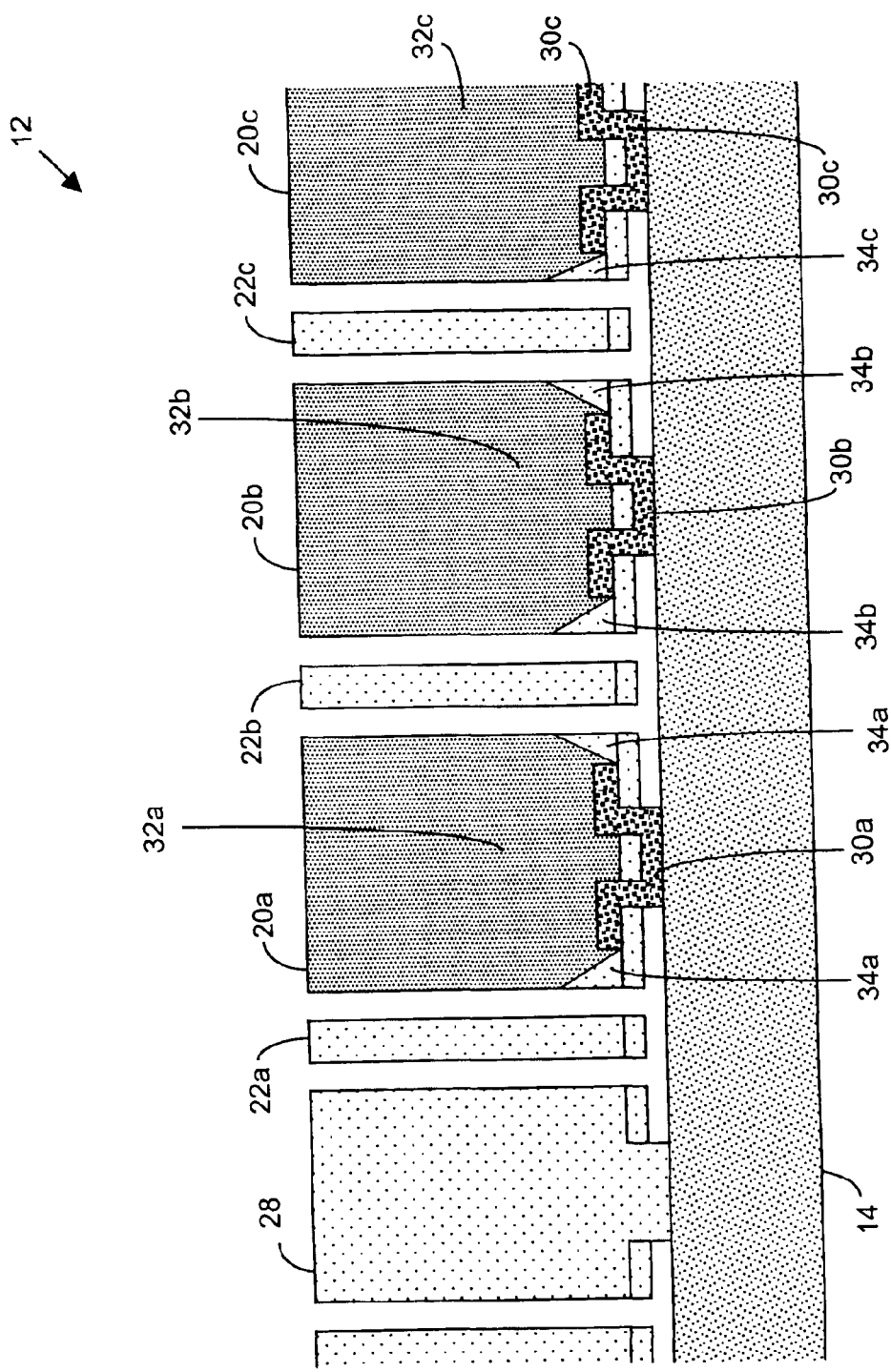
FIG. 5 illustrates, among other things, a cross-sectional view of the microstructure of FIG. 3 that employed non-conformal deposition, growth and/or formation techniques of single vs. polycrystalline crystal structures.

For example, with reference to FIG. 5, mechanical structures 20a–c may be comprised of substantially polycrystalline structures. As mentioned above, active layer 48 may be deposited, formed and/or grown using a predetermined set of parameters that deposit, form and/or grow monocrystalline portion 34a–c of mechanical structures 20a–c in a "retreating" manner. As such, polycrystalline portion 32a–c will deposit, from and/or grow in an "advancing" manner. Thus, in this embodiment, mechanical structures 20a–c are substantially polycrystalline, for example, polycrystalline silicon.

The environment (for example, the gas or gas vapor pressure) within chambers 52 and 60 determine to some extent the mechanical damping for mechanical structures 20a–c and 22a–f. In this regard, chambers 52 and 60 may include a fluid that is "trapped", "sealed" and/or contained within chambers 52 and 60. The state of the fluid within chambers 52 and 60 (for example, the pressure) may be determined using conventional techniques and/or using those techniques described and illustrated in non-provisional patent application entitled "Electromechanical System having a Controlled Atmosphere, and Method of Fabricating Same", which was filed on Mar. 20, 2003 and assigned Ser. No. 10/392,528 (hereinafter "the Electromechanical System having a Controlled Atmosphere Patent Application"). For the sake of brevity, all of the inventions described and illustrated in the Electromechanical System having a Controlled Atmosphere Patent Application will not be repeated here. It is expressly noted, however, that the entire contents of the Electromechanical System having a Controlled Atmosphere Patent Application, including for example, the features, attributes, alternatives, materials, techniques and advantages of all of the inventions, are incorporated by reference herein.

Further, as mentioned above, the anchors and anchoring techniques described herein may be implemented in conjunction with mechanical structures 12 having one or more transducers or sensors which may themselves include multiple layers that are vertically and/or laterally stacked or interconnected as illustrated in Microelectromechanical Systems and Method of Encapsulating Patent Application (see, for example, micromachined mechanical structure 12b of FIG. 11A; mechanical structure 12 of FIGS. 11B and 11C; and mechanical structures 20a and 20b, contact areas 24a and 24b, and buried contacts 24' and 24" of FIG. 11D) and/or Microelectromechanical Systems Having Trench Isolated Contacts Patent Application (see, for example, micromachined mechanical structure 12b of FIG. 13A; micromachined mechanical structure 12 of FIGS. 13B and 13C; and mechanical structures 20a and 20b, contact areas 24a and 24b, and buried contacts 24' and 24" of FIG. 13D). Accordingly, any and all of the anchoring embodiments illustrated and described herein may be implemented in the embodiments of Microelectromechanical Systems and Method of Encapsulating Patent Application and/or Microelectromechanical Systems Having Trench Isolated Contacts Patent Application that include multiple layers of mechanical structures, contacts areas and buried contacts that are vertically and/or laterally stacked or interconnected (see, for example, micromachined mechanical structure 12 of FIGS. 11B, 11C and 11D of Microelectromechanical Systems and Method of Encapsulating Patent Application and/or micromachined mechanical structure 12 of FIGS. 13B, 13C and 13D of Microelectromechanical Systems Having Trench Isolated Contacts Patent Application). Under this circumstance, the mechanical structures may be fabricated using anchoring techniques described in this application wherein the mechanical structures include one or more processing steps to provide the vertically and/or laterally stacked and/or interconnected multiple layers (see, for example, fixed electrode 20a of FIG. 14A).

Moreover, the anchors and anchoring techniques described herein may be implemented to secure, anchor and/or affix any of the contacts to a structure or substrate (for example, substrate 38). Thus, any or all of the contacts, regardless of level (for example, contact 24 of FIG. 14B) may be fixed or secured using the anchors and anchoring techniques described herein.

The term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD)).

Further, in the claims, the term "contact" means a conductive region, partially or wholly disposed outside the chamber, for example, the contact area and/or contact via.

Finally, it should be further noted that while the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to microelectronics.

What is claimed is:

1. An electromechanical device comprising:
   a substrate;
   an insulation layer disposed on the substrate;
   a first semiconductor layer disposed on or above the insulation layer;
   an anchor that is disposed in an opening in the insulation layer and the first semiconductor layer and contacts the substrate, wherein the anchor includes a material that is different than the insulation layer;
   a second semiconductor layer, disposed on the anchor and on the first semiconductor layer; and
   a fixed electrode, formed, in part, from the first and second semiconductor layers, wherein the fixed electrode is affixed to the substrate via the anchor.

2. The device of claim 1 wherein the anchor includes silicon nitride, silicon carbide, germanium, silicon/germanium or gallium arsenide.

3. The device of claim 1 wherein the insulation layer includes silicon nitride or silicon oxide.

4. The device of claim 1 further including a moveable electrode, juxtaposed the fixed electrode, wherein the moveable electrode is formed in part from the second semiconductor layer.

5. The device of claim 4 wherein the insulation layer includes silicon oxide and the anchor material includes silicon nitride, silicon carbide, germanium, silicon/germanium or gallium arsenide.

6. The device of claim 4 wherein the insulation layer includes silicon oxide and the anchor material includes silicon, silicon carbide, germanium, silicon/germanium, or gallium arsenide.

7. The device of claim 4 wherein the insulation layer includes silicon nitride and the anchor material includes silicon, silicon oxide, silicon carbide, germanium, silicon/germanium or gallium arsenide.

8. The device of claim 1 wherein a substantial portion of the fixed electrode overlying the anchor material is a monocrystalline silicon.

9. The device of claim 1 wherein a substantial portion of the fixed electrode overlying the anchor material is a polycrystalline silicon.

10. The device of claim 1 further including:
a chamber defined in part by a first encapsulation layer having at least one vent;
a moveable electrode disposed in the chamber and juxtaposed the fixed electrode;
a second encapsulation layer, deposited over or in the at least one vent, to thereby seal the chamber, wherein the second encapsulation layer includes a semiconductor material.

11. The device of claim 10 wherein the second encapsulation layer includes polycrystalline silicon, porous polycrystalline silicon, amorphous silicon, silicon carbide, silicon/germanium, germanium or gallium arsenide.

12. The device of claim 11 wherein the first encapsulation layer includes polycrystalline silicon, porous polycrystalline silicon, amorphous silicon, germanium, silicon/germanium, gallium arsenide, silicon nitride or silicon carbide.

13. The device of claim 10 wherein:
the first encapsulation layer is a semiconductor material that is doped with a first impurity to provide a first region of a first conductivity type, and
the semiconductor material of the second encapsulation layer is doped with a second impurity to provide a second region with a second conductivity type and wherein the first conductivity type is opposite the second conductivity type.

14. The device of claim 10 further including a contact having at least a portion that is disposed outside the chamber.

15. The device of claim 10 wherein a first portion of the first encapsulation layer is a monocrystalline silicon and a second portion of the first encapsulation layer is a polycrystalline silicon.

16. The device of claim 10 wherein a first portion of the first encapsulation layer is a monocrystalline silicon and a second portion of the first encapsulation layer is a porous or amorphous silicon.

17. The device of claim 16 wherein the second encapsulation layer overlying the second portion of the first encapsulation layer is a polycrystalline silicon.

18. The device of claim 17 includes a field region disposed outside and above the chamber wherein the field region is a monocrystalline silicon.

19. An electromechanical device comprising:
a substrate;
an insulation layer disposed on the substrate;
a first semiconductor layer disposed on or above the insulation layer;
an anchor that is disposed in an opening in the insulation layer and the first semiconductor layer and contacts the substrate, wherein the anchor includes a material that is different than the insulation layer;
a second semiconductor layer, disposed on the anchor;
a fixed electrode, formed, in part, from the second semiconductor layer, wherein the fixed electrode is affixed to the substrate via the anchor;
a moveable electrode, formed in part from the second semiconductor layer, wherein the moveable electrode is disposed in a chamber wherein the chamber is defined in part by a first encapsulation layer;
a second encapsulation layer, deposited over or in at least one vent, to thereby seal the chamber, wherein the second encapsulation layer includes a semiconductor material;
a contact; and
a trench, disposed around at least a portion of the contact, wherein the trench is disposed outside the chamber and wherein the trench includes a first material disposed therein to electrically isolate the contact.

20. The device of claim 19 wherein the second encapsulation layer includes polycrystalline silicon, porous polycrystalline silicon, amorphous silicon, silicon carbide, silicon/germanium, germanium, or gallium arsenide.

21. The device of claim 20 wherein the first encapsulation layer includes polycrystalline silicon, porous polycrystalline silicon, amorphous silicon, germanium, silicon/germanium, gallium arsenide, silicon nitride or silicon carbide.

22. The device of claim 19 wherein the first material is disposed on at least the outer surfaces of the trench.

23. The device of claim 22 wherein a semiconductor material is disposed in the trench, wherein the semiconductor material surrounded by the first material in the trench.

24. The device of claim 22 wherein the trench is disposed on an etch stop region.

25. The device of claim 22 wherein the etch stop region is a silicon nitride or silicon dioxide.

26. The device of claim 22 wherein the first material is a silicon nitride or silicon dioxide.

27. The device of claim 22 wherein the trench surrounds the contact.

28. The device of claim 19 wherein the anchor includes silicon nitride, silicon carbide, germanium, silicon/germanium or gallium arsenide.

29. The device of claim 19 wherein the insulation layer includes silicon nitride or silicon oxide.

30. The device of claim 19 wherein the insulation layer includes silicon oxide and the anchor material includes silicon nitride, silicon carbide, germanium, silicon/germanium or gallium arsenide.

31. The device of claim 19 wherein the insulation layer includes silicon nitride and the anchor material includes silicon, silicon oxide, silicon carbide, germanium, silicon/germanium or gallium arsenide.

32. The device of claim 19 wherein a substantial portion of the fixed electrode overlying the anchor material is a monocrystalline silicon.

33. The device of claim 19 wherein a substantial portion of the fixed electrode overlying the anchor material is a polycrystalline silicon.

34. An electromechanical device comprising:

a substrate;

an insulation layer disposed on the substrate;

a first semiconductor layer disposed on or above the insulation layer;

an anchor that is disposed in an opening in the insulation layer and the first semiconductor layer an contacts the substrate, wherein the anchor includes a material that is different than the insulation layer;

a second semiconductor layer, disposed on the anchor and on the first semiconductor;

a fixed electrode, formed, in part, from the first and second semiconductor layers, wherein the fixed electrode is affixed to the substrate via the anchor;

a moveable electrode, formed in part from the second semiconductor layer, wherein the moveable electrode is disposed in a chamber wherein the chamber is defined in part by a first encapsulation layer;

a second encapsulation layer, deposited over or in at least one vent, to thereby seal the chamber, wherein the second encapsulation layer includes a semiconductor material;

a contact; and a trench, disposed around at least a portion of the contact, wherein the trench is disposed outside the chamber and wherein the trench includes an insulating material disposed therein.

35. The device of claim 34 wherein the second encapsulation layer includes polycrystalline silicon, porous polycrystalline silicon, amorphous silica , silicon carbide, silicon/germanium, germanium, or gallium arsenide.

36. The device of claim 35 wherein the first encapsulation layer includes polycrystalline silicon, porous polycrystalline silicon, amorphous silicon, germanium, silicon/germanium, gallium arsenide, silicon nitride or silicon carbide.

37. The device of claim 34 wherein the insulating material is disposed on at least the outer surfaces of the trench.

38. The device of claim 37 wherein a semiconductor material which is disposed in the trench, wherein the semiconductor material is surrounded in the trench by the insulating material.

39. The device of claim 37 wherein the trench is disposed on an etch stop region.

40. The device of claim 37 wherein the etch stop region is a silicon nitride or silicon dioxide.

41. The device of claim 37 wherein the insulating material is a silicon nitride or silicon dioxide.

42. The device of claim 37 wherein the trench surrounds the contact.

43. The device of claim 34 wherein the anchor includes silicon nitride, silicon carbide, germanium, silicon/germanium or gallium arsenide.

44. The device of claim 34 wherein the insulation layer includes silicon nitride or silicon oxide.

45. The device of claim 34 wherein the insulation layer includes silicon oxide and the anchor material includes silicon nitride, silicon carbide, germanium, silicon/germanium or gallium arsenide.

46. The device of claim 34 wherein the insulation layer includes silicon nitride and the anchor material includes silicon, silicon oxide, silicon carbide, germanium, silicon/germanium or gallium arsenide.

47. The device of claim 34 wherein a substantial portion of the fixed electrode overlying the anchor material is a monocrystalline silicon.

48. The device of claim 34 wherein a substantial portion of the fixed electrode overlying the anchor material is a polycrystalline silicon.

* * * * *